United States Patent
Bae et al.

(10) Patent No.: US 9,202,773 B2
(45) Date of Patent: Dec. 1, 2015

(54) SEMICONDUCTOR MODULE AND MODULE SYSTEM HAVING THE SAME

(75) Inventors: Jin-Kwon Bae, Hwaseong-si (KR); Eun-Seok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 603 days.

(21) Appl. No.: 13/547,595

(22) Filed: Jul. 12, 2012

(65) Prior Publication Data

US 2013/0077239 A1    Mar. 28, 2013

(30) Foreign Application Priority Data

Sep. 23, 2011  (KR) .................. 10-2011-0096564

(51) Int. Cl.
*H05K 7/20* (2006.01)
*H01L 23/467* (2006.01)

(52) U.S. Cl.
CPC ....... *H01L 23/467* (2013.01); *H01L 2924/0002* (2013.01)

(58) Field of Classification Search
CPC ........ G06F 1/20; H05K 7/2003; H05K 7/209; H01L 23/467
See application file for complete search history.

(56) References Cited

U.S. PATENT DOCUMENTS

| | | | | |
|---|---|---|---|---|
| 5,873,407 A * | 2/1999 | Wang et al. | | 165/80.3 |
| 6,222,729 B1 * | 4/2001 | Yoshikawa | | 361/695 |
| 7,120,018 B2 * | 10/2006 | Shen et al. | | 361/695 |
| 7,579,687 B2 * | 8/2009 | Szewerenko et al. | | 257/707 |
| 7,760,498 B2 * | 7/2010 | Shan et al. | | 361/695 |
| 8,120,907 B2 * | 2/2012 | Chen et al. | | 361/690 |
| 8,730,670 B1 * | 5/2014 | Zohni et al. | | 361/690 |
| 2007/0235168 A1 * | 10/2007 | Chen et al. | | 165/124 |
| 2008/0041562 A1 * | 2/2008 | Bhatia | | 165/80.3 |
| 2009/0309214 A1 * | 12/2009 | Szewerenko et al. | | 257/707 |
| 2011/0080700 A1 * | 4/2011 | Bland et al. | | 361/679.5 |

FOREIGN PATENT DOCUMENTS

| | | |
|---|---|---|
| JP | 6120386 A | 4/1994 |
| JP | 11204974 A | 7/1999 |
| JP | 2003338594 A | 11/2003 |

* cited by examiner

*Primary Examiner* — Gregory Thompson
(74) *Attorney, Agent, or Firm* — Sughrue Mion, PLLC

(57) ABSTRACT

Provided is a semiconductor module. The semiconductor module includes a substrate including a first surface and a second surface opposite to the first surface. A semiconductor device is disposed on the first surface of the substrate. An airflow guide is disposed on the second surface of the substrate. The airflow guide includes a plate including an end portion distantly from the second surface.

19 Claims, 20 Drawing Sheets

SEMICONDUCTOR MODULE AND MODULE SYSTEM HAVING THE SAME

CROSS-REFERENCE TO RELATED APPLICATION

This application claims priority under 35 U.S.C. §119 to Korean Patent Application No. 10-2011-0096564 filed on Sep. 23, 2011, the disclosure of which is hereby incorporated by reference in its entirety.

BACKGROUND

1. Field

Exemplary embodiments relate to a semiconductor module, a module system and an electronic system.

2. Description of Related Art

Heat generated during operation of a semiconductor device may cause a semiconductor module, a module system and an electronic system to electronically malfunction or have a short lifespan.

SUMMARY

One or more exemplary embodiments may provide a semiconductor module, a module system and an electronic system which lower a temperature of a semiconductor device, the semiconductor module, the module system and/or the electronic system.

Exemplary embodiments are not limited to the specific descriptions set forth herein.

According to an aspect of an exemplary embodiment, a semiconductor module comprises a substrate. The substrate may have a first surface and a second surface opposite to the first surface. A semiconductor device may be disposed on the first surface of the substrate. An airflow guide may be disposed on the second surface of the substrate. The airflow guide may include a plate having an end portion extending from the second surface.

According to an aspect of another exemplary embodiment, a module system includes a first module including a first substrate and a register. The first substrate may have a first surface and a second surface opposite to the first surface. The register may be disposed on the second surface of the first substrate. A second module may include a second substrate and an airflow guide. The second substrate may be parallel to the first substrate and may have a first surface and a second surface opposite to the first surface. The airflow guide may be disposed on the first surface of the second substrate. The airflow guide may include a pedestal disposed on the first surface of the second substrate and a plate attached to the pedestal, wherein the plate may extend from the pedestal toward the first register.

According to an aspect of another exemplary embodiment, a module system includes a first module and second module. The first module includes a first substrate having a first surface and a second surface opposite the first surface, a plurality of memory devices disposed on both surfaces of the first and second surfaces, and a first register disposed on the second surface of the first substrate. The second module includes a second substrate having a first surface and a second surface opposite the first surface, a plurality of memory devices disposed on both surfaces of the first and second surfaces, a first airflow guide disposed on the first surface of the second substrate, and a second register disposed on the second surface of the second substrate. The airflow guide extends toward the first register.

Other exemplary embodiments may be suggested by the specification and drawings.

BRIEF DESCRIPTION OF THE DRAWINGS

The foregoing and other exemplary aspects and advantages to be apparent from the following description of exemplary embodiments, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
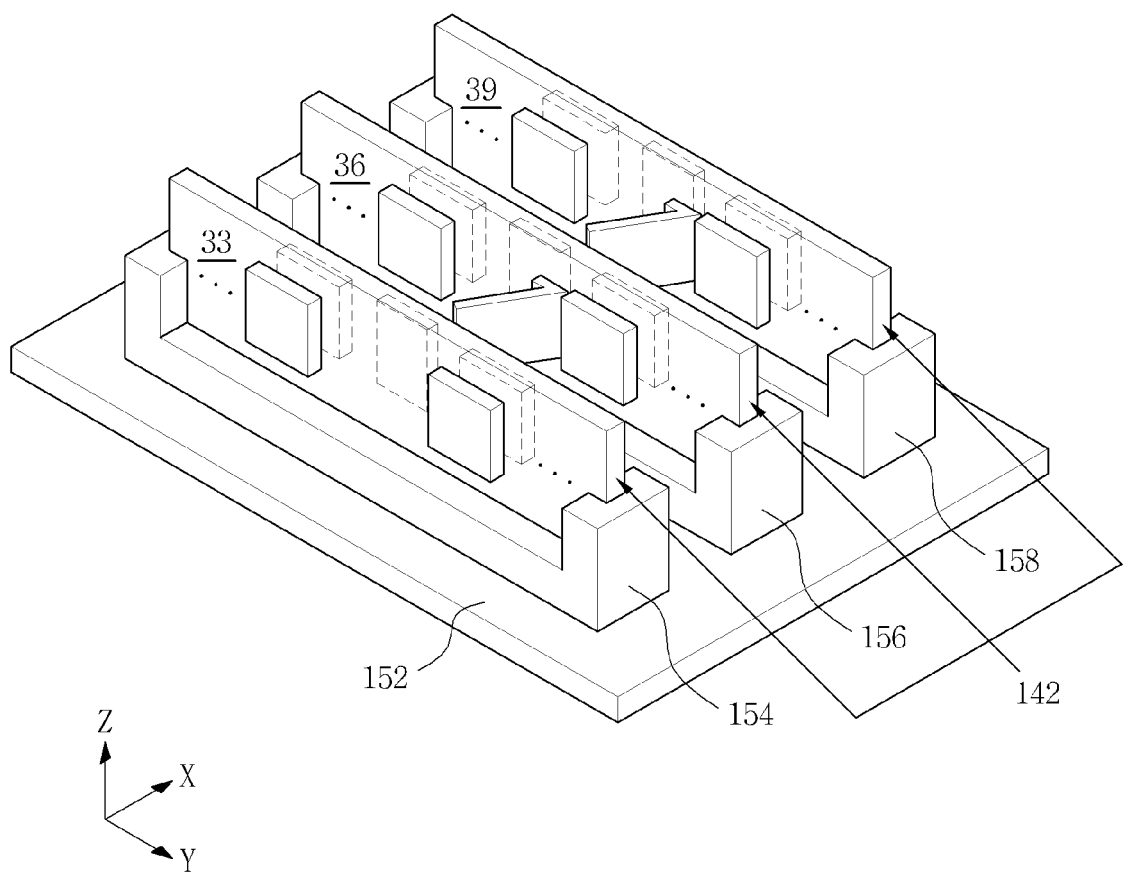
FIG. 1 is a perspective view of an electronic system according to an exemplary embodiment.

Various exemplary embodiments will now be described more fully with reference to the accompanying drawings in which some exemplary embodiments are shown. However, specific structural and functional details disclosed herein are merely representative for purposes of describing exemplary embodiments. Thus, the invention may be embodied in many alternate forms and should not be construed as limited to only those exemplary embodiments set forth herein. Therefore, it should be understood that there is no intent to limit exemplary embodiments to the particular forms disclosed, but on the contrary, exemplary embodiments are to cover all modifications, equivalents, and alternatives, as would be understood by one of skill in the art.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that, if an element is referred to as being "connected" or "coupled" with another element, it can be directly connected, or coupled, to the other element or intervening elements may be present. In contrast, if an element is referred to as being "directly connected" or "directly coupled" with another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of other exemplary embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shape illustrated herein but may include deviations in shapes that result, for example, from manufacturing. For example, a mount leading hole in a pedestal may be shaped as a clamper or horseshoe feature rather than a letter 'U', when being viewed in a top view. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings. However, the described exemplary embodiments are not intended to be limiting.

An electronic system according to an exemplary embodiment will now be described by referring to FIG. 1.

FIG. 1 is a perspective view of an electronic system according to an exemplary embodiment.

Referring to FIG. 1, an electronic system 160 according to an exemplary embodiment may include a mother board 152, first to third sockets 154, 156 and 158, and a module system 142. The electronic system 160 may be included in a processor based system, for example, a personal computer or a server.

The mother board 152 may include a printed circuit board. The mother board 152 may be electronically connected to the first to third sockets 154, 156 and 158. The first to third sockets 154, 156 and 158 may be sequentially disposed on the mother board 152. Other sockets may be further disposed on the mother board 152.

The module system 142 may include first to third semiconductor modules 33, 36 and 39. The first to third semiconductor modules 33, 36 and 39 may be inserted into the first to third sockets 154, 156 and 158, respectively. The first to third semiconductor modules 33, 36 and 39 may be electronically connected to the first to third sockets 154, 156 and 158.

Figure 2A:
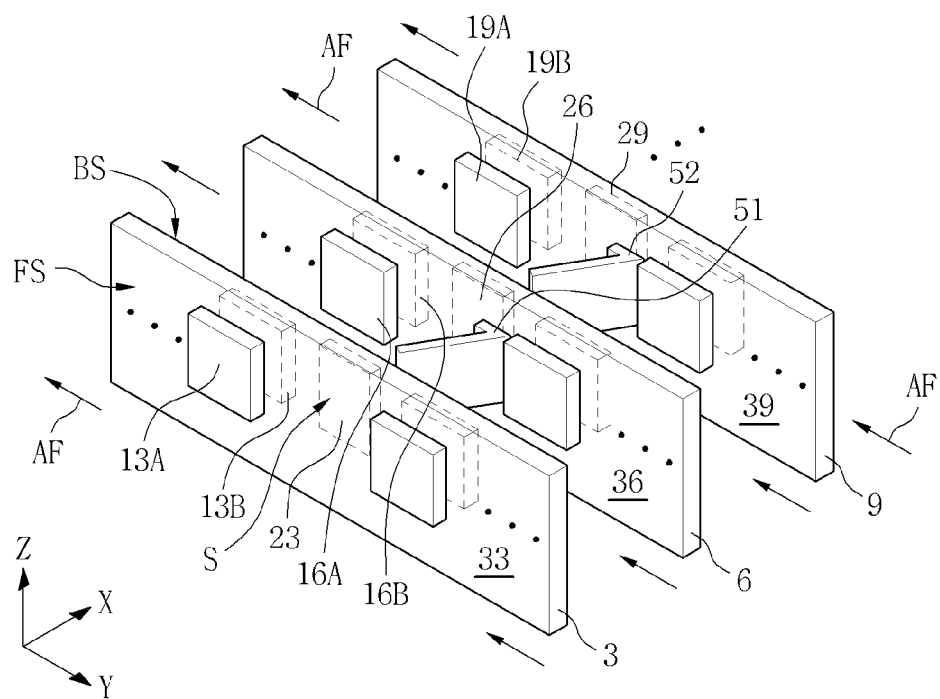
FIG. 2A is a perspective view of a module system and an airflow in the module system according to an exemplary embodiment.

The module system 142 may store external data in first to third memories 13A, 13B, 16A, 16B, 19A and 19B of FIG. 2A through the mother board 152, the first to third sockets 154, 156, 158, and first to third registers 23, 26, and 29. Conversely, the module system 142 may transmit data stored in the first to third memories 13A, 13B, 16A, 16B, 19A and 19B to the exterior through the mother board 152, the first to third sockets 154, 156, 158, and the first to third registers 23, 26, and 29.

The module system 142 will be described in more detail in FIGS. 2A to 2F.

FIG. 2A is a perspective view of a module system and an airflow in the module system according to an exemplary embodiment.

Referring to FIG. 2A, the module system 142 according to an exemplary embodiment may include first to third semiconductor modules 33, 36 and 39. The first to third semiconductor modules 33, 36 and 39 may include first to third module substrates 3, 6 and 9, respectively. The first to third module substrates 3, 6 and 9 may be substantially parallel with each other.

The first to third module substrates 3, 6 and 9 may each include a printed circuit board. Each of the first to third module substrates 3, 6 and 9 may each include a front surface FS and a back surface BS. The first semiconductor module 33 may include first memory devices 13A and 13B disposed on the front surface FS and the back surface BS of the first module substrate 3, and a first register 23 disposed on the back surface BS of the first module substrate 3.

The first memory devices 13A and 13B may include a volatile memory device and/or a non-volatile memory device. For example, the first memory devices 13A and 13B may include dynamic random access memories. Eight or more of the first memory devices 13A and 13B may be disposed on the front surface FS and the back surface BS of the first module substrate 3.

In an exemplary embodiment, the front surface FS of the first module substrate 3 may include a space region S corresponding to the location of the first register 23 on the back surface BS. The first memory devices 13B disposed on the back surface BS of the first module substrate 3 may be respectively aligned with the first memory devices 13A disposed on the front surface FS of the first module substrate 3 in the horizontal and vertical directions (Y- and Z-directions, as shown in FIG. 2A).

The first register 23 may be disposed on a central region of the back surface BS of the first module substrate 3. The first register 23 may be disposed between the first memory devices 13B. The first register 23 may be electronically connected to the first memory devices 13A and 13B.

The first register 23 may include a logic circuit to distribute external data to the first memory devices 13A and 13B, or to remove data skews of the first memory devices 13A and 13B on the first module substrate 3.

The second semiconductor module 36 may include second memory devices 16A and 16B disposed on the front surface FS and the back surface BS of the second module substrate 6, an airflow guide 51 disposed on the front surface FS of the second module substrate 6, and a second register 26 disposed on the back surface BS of the second module substrate 6. The second memory devices 16A and 16B may be the same number as the first memory devices 13A and 13B.

The second memory devices 16A and 16B may be the same kind of memory device as the first memory devices 13A and 13B. The second register 26 may be the same number as the first register 23. The second register 26 may include a logic circuit the same as the first register 23. The second register 26 may be electronically connected to the second memory devices 16A and 16B.

The second memory devices 16A and 16B and the second register 26 may have the same arrangement on the second module substrate 6 as the first memory devices 13A and 13B and the first register 23 on the first module substrate 3. The second memory devices 16A and 16B and the second register 26 may be aligned with the first memory devices 13A and 13B and the first register 23 in the horizontal and vertical directions (Y- and Z-directions, as shown in FIG. 2A.

At least one airflow guide 51 may be provided on the module substrate 6. The airflow guide 51 may have a shape substantially consistent with that of the letter 'L'. The airflow guide 51 may include insulating material or insulating material and conductive material stacked on the insulating material. The airflow guide 51 may be disposed on the front surface FS of the second module substrate 6 in a region opposite that of the second register 26 on the back surface BS.

For example, the airflow guide 51 may be disposed on a central region of the front surface FS of the second module substrate 6. The airflow guide 51 may be disposed between the second memory devices 16A on the front surface FS of the second module substrate 6.

The third semiconductor module 39 may include third memory devices 19A and 19B disposed on the front surface FS and the back surface BS of the third module substrate 9, an airflow guide 52 disposed on the front surface FS of the third module substrate 9, and a third register 29 disposed on the back surface BS of the third module substrate 9. The airflow guides 51 and 52 may be described in more detail by referring to other drawings.

The third memory devices 19A and 19B may number the same as the first memory devices 13A and 13B. The third memory devices 19A and 19B may be the same kind of memory device as the first memory devices 13A and 13B. The third register 29 may number the same as the first register 23. A logic circuit of the third register 29 may be the same kind of logic circuit as that of the first register 23.

The third register 29 may be electronically connected to the third memory devices 19A and 19B. The third memory devices 19A and 19B, the third register 29 and the airflow guide 52 may have the same arrangement on the third module substrate 9 as the second memory devices 16A and 16B, the second register 26 and the airflow guide 51 have on the front surface FS and the back surface BS of the second module substrate 6.

The third memory devices 19A and 19B, the third register 29 and the airflow guide 52 may be aligned with the second memory devices 16A and 16B, the second register 26 and the airflow guide 51 in the horizontal and vertical directions (Y- and Z-directions, as shown in FIG. 2A. The third semiconductor module 39 may be repeatedly disposed in the X-direction.

While the electronic system 160 of FIG. 1 is being driven, heat is generated in the first to third registers 23, 26 and 29 and the first to third memory devices 13A, 13B, 16A, 16B, 19A and 19B. In order to lower a temperature of the first to third registers 23, 26 and 29 and the first to third memory devices 13A, 13B, 16A, 16B, 19A and 19B, the electronic system 160 has an airflow AF between the first to third semiconductor modules 33, 36 and 39.

The airflow AF, for example, may flow opposite to a Y-direction to be in contact with the first to third semiconductor modules 33, 36 and 39.

Figure 2B:
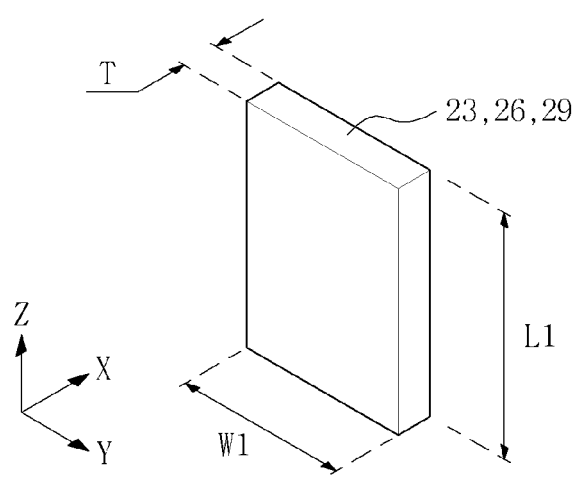
FIGS. 2B and 2C are perspective views respectively of a register and an airflow guide of FIG. 2A.

FIG. 2B is a perspective view of an exemplary register of FIG. 2A.

Referring to FIG. 2B, each of the first to third registers 23, 26 and 29 may have a thickness T in the X-direction, a first width W1 in the Y-direction, and a first length L1 in the Z-direction.

Figure 2C:
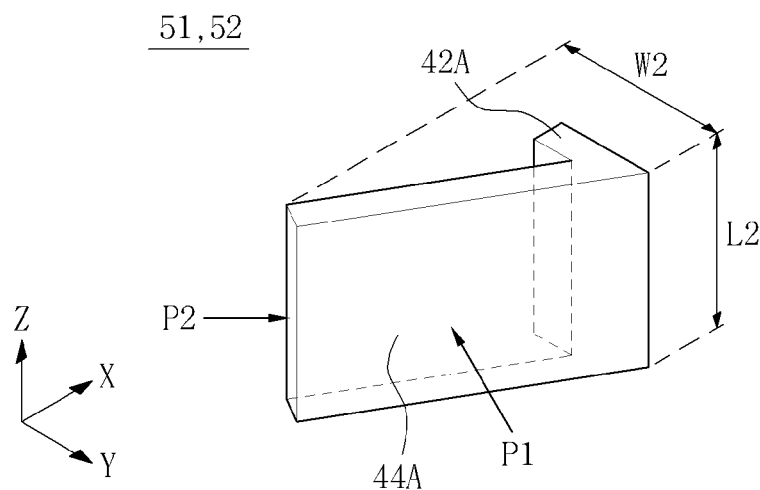

FIG. 2C is a perspective view of an exemplary airflow guide.

Referring to FIG. 2C, each of the airflow guides 51 and 52 may include a pedestal 42A and a plate 44A. The pedestal 42A may be disposed and fixed on the front surface FS of one of the module substrates (e.g. the second module substrate 6 or the third module substrate 9). The pedestal 42A and the plate 44A may have a second length L2 in the Z-direction.

A first end portion of the plate 44A may be fixed on and/or combined with a portion of the pedestal 42A. For example, the first end portion may be directly fixed to a surface of one of the module substrates. The second end portion of the plate 44A may extend toward the first register 23. For example, the second end portion of the plate 44A may extend away from the surface of the second substrate 6 or the third module substrate 9.

For example, an extension line from the first end portion to the second end portion of the plate 44A may penetrate the first register 23 or an adjacent module substrate. When viewed from the Z-direction, the plate 44A may be obliquely inclined with respect to the pedestal 42A. That is, the plate 44A (and the extension line) may form an angle between about 45° and about 90° with respect to the pedestal (and a surface of the module substrate to which the pedestal is attached).

The plate 44A may include a guiding surface P1 and a leading surface P2. The guiding surface P1 may be located between the first and second end portions of the plate 44, and the leading surface P2 may correspond to the second end portion.

The guiding surface P1 may be flat. The guiding surface P1 may be in contact with air. Apart of airflow may be shifted by the guiding surface P1 of the plate 44A. Other part of airflow may flow around a periphery of each of the airflow guides 51 and 52.

The second end portion of the plate 44A may extend from the portion of the pedestal 42A to an opposite side to the second register 26 or the third register 29. The leading surface P2 may be formed at the second end portion. The leading surface P2 may be in contact with the guiding surface P1 at the second end portion of the plate 44A. In other words, the leading surface P2 may be adjacent to the guiding surface P1

The leading surface P2 may directly the air flow from the guiding surface P1 to a register on an adjacent module substrate (e.g. the first register 23 or the second register 26). The guiding surface P1 may have a second width W2, when viewed from the X-direction.

Figure 2D:
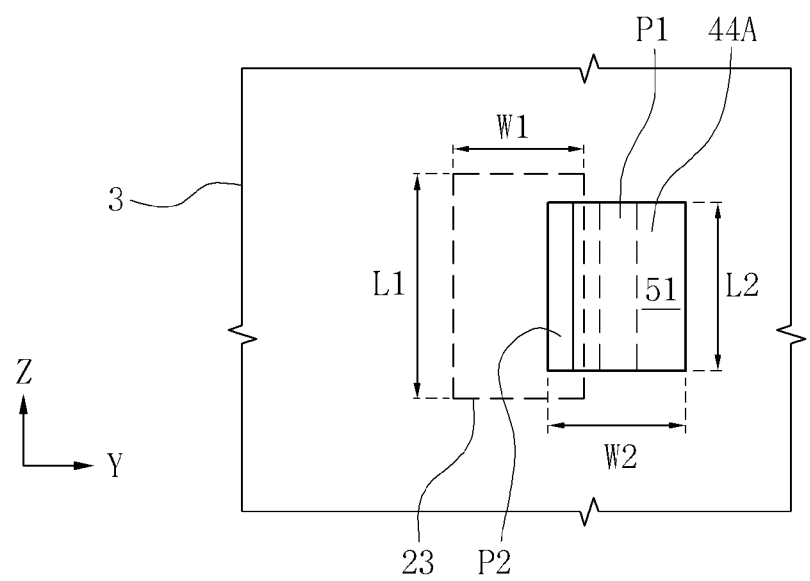
FIG. 2D is a schematic view illustrating a positional relationship of a module substrate, a register and an airflow guide when viewed in an X-direction of FIG. 2A.

FIG. 2D is a schematic view illustrating a positional relationship of a module substrate, a register and an airflow guide when viewed from the X-direction of FIG. 2A.

Referring to FIG. 2D, the first register 23 and the airflow guide 51 may be blocked by the first module substrate 3 when viewed from the X-direction of FIG. 2A. The first module substrate 3 is drawn with solid lines due to being visible. The first register 23 and the airflow guide 51 are drawn dotted lines.

The first register 23 may be partially overlapped with the plate 44A of the airflow guide 51. The second end portion or the leading surface P2 of the plate 44A may be located above the first register 23 or the second register 26. That is, the second end portion or the leading surface P2 of the plate 44A may overlap the first register 23 or the second register 26 in the X-direction.

Figure 2E:
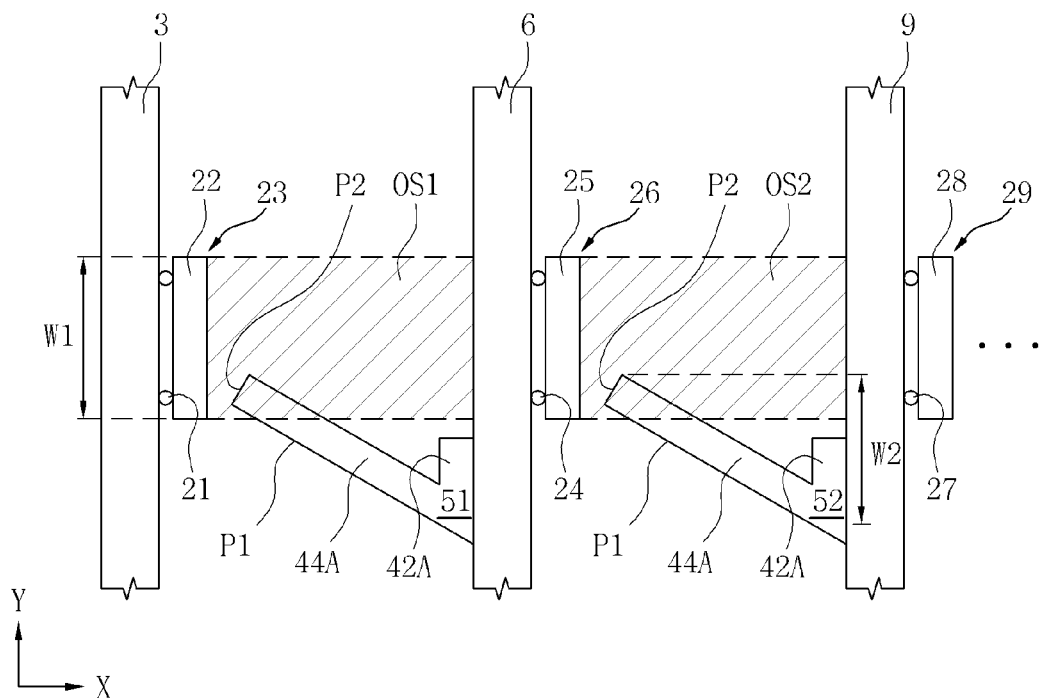
FIG. 2E is a schematic view illustrating a positional relationship of module substrates, registers and airflow guides when viewed in a Z-direction of FIG. 2A.

FIG. 2E is a schematic view illustrating a positional relationship of module substrates, registers and airflow guides when viewed from the Z-direction of FIG. 2A.

Referring to FIG. 2E, when the first to third module substrates 3, 6 and 9 are viewed from the Z-direction (or an upper portion) of FIG. 2A, the first to third registers 23, 26 and 29 may include solder balls 21, 24 and 27 and package bodies 22, 25 and 28. The solder balls 21, 24 and 27 may electronically connect the first to third module substrates 3, 6 and 9 to the package bodies 22, 25 and 28.

A first overlapping space OS1 may be a space through which the first register 23 and the second module substrate 6 overlap in the X-direction. A second overlapping space OS2 may be a space through which the second register 26 and the third module substrate 9 overlap in the X-direction. The airflow guide 51 between the first and second module substrates 3 and 6 and the airflow guide 52 between the second and third module substrates 6 and 9 may be aligned and may overlap each other in the X-direction. In more detail, the airflow guides 51 and 52 may have first end portions fixed to the second and third module substrates 6 and 9, respectively, and second end portions disposed within the first and second overlapping spaces OS1 and OS2. In other words, the second end portions may overlap the first, second, and third registers 23, 26 and 29 in the X-direction, when viewed from the Z-direction.

The pedestal 42A of each of the airflow guides may be spaced apart from the first and second overlapping spaces OS1 and OS2. Thus, the first end portions of the plates 44A may be located outside of the first and second overlapping spaces OS1 and OS2, and the second end portions of the plates 44A may be located inside of the first and second overlapping spaces OS1 and OS2.

Each of the plates 44A may form a predetermined angle between about 45° and about 90° with respect to the front surface FS of the module substrate to which the pedestal is attached. The plate 44A (and the extension line of the plate 44A extending from the pedestal 42A toward the first module substrate 3 or the second module substrate 6) may penetrate the first register 23 or the second register 26.

Figure 2F:
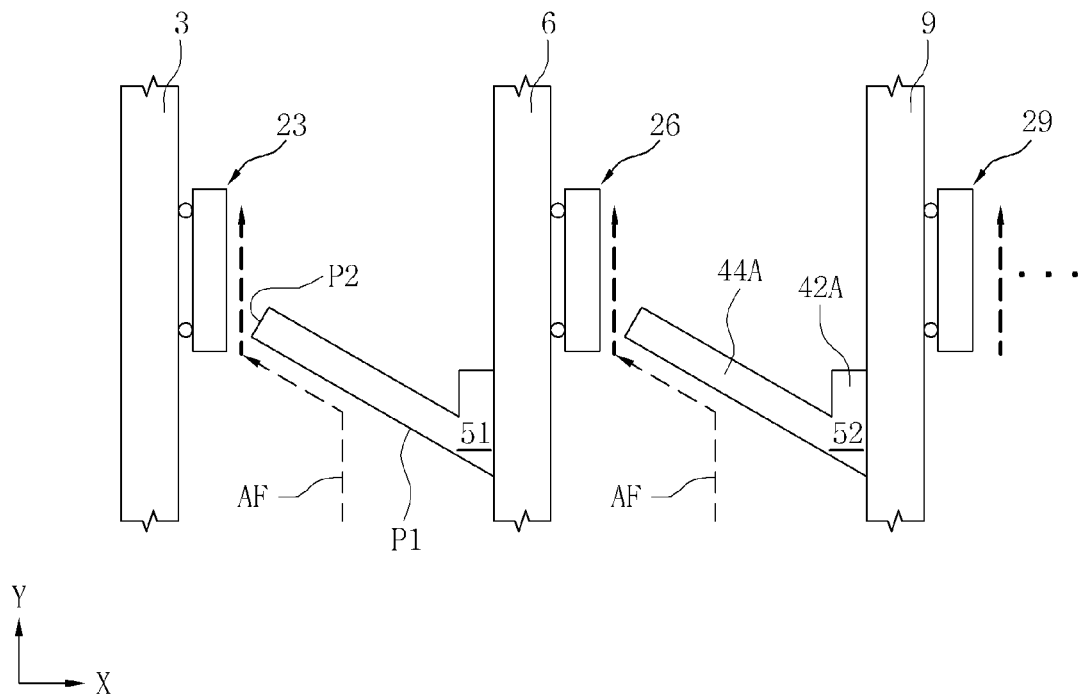
FIG. 2F is a schematic view illustrating an airflow in a module system in more detail when viewed in a Z-direction of FIG. 2A.

FIG. 2F is a schematic view illustrating an airflow in a module system in more detail when viewed from a Z-direction of FIG. 2A.

Referring to FIG. 2F, while the electronic system 160 of FIG. 1 is being driven, the airflow AF of FIG. 2A may be formed between the first to third module substrates 3, 6 and 9, when viewed from the Y-direction. A portion of the airflow AF may be shifted from the direction of its movement by the airflow guides 51 and 52 between the first to third module substrates 3, 6 and 9.

The airflow guides 51 and 52 may partially block spaces between the first and second module substrates 3 and 6 and between the second and third module substrates 6 and 9 to focus the portion of the airflow AF on the first and second registers 23 and 26. The air may be in contact with the first register 23 or the second register 26 to more effectively dissipate heat generated by the first register 23 or the second register 26.

In an exemplary embodiment, the air may lower a temperature of the first register 23 or the second register 26 by more than 15° C. compared to a case in which no first and second airflow guides 51 and 52 are present.

Figure 3A:
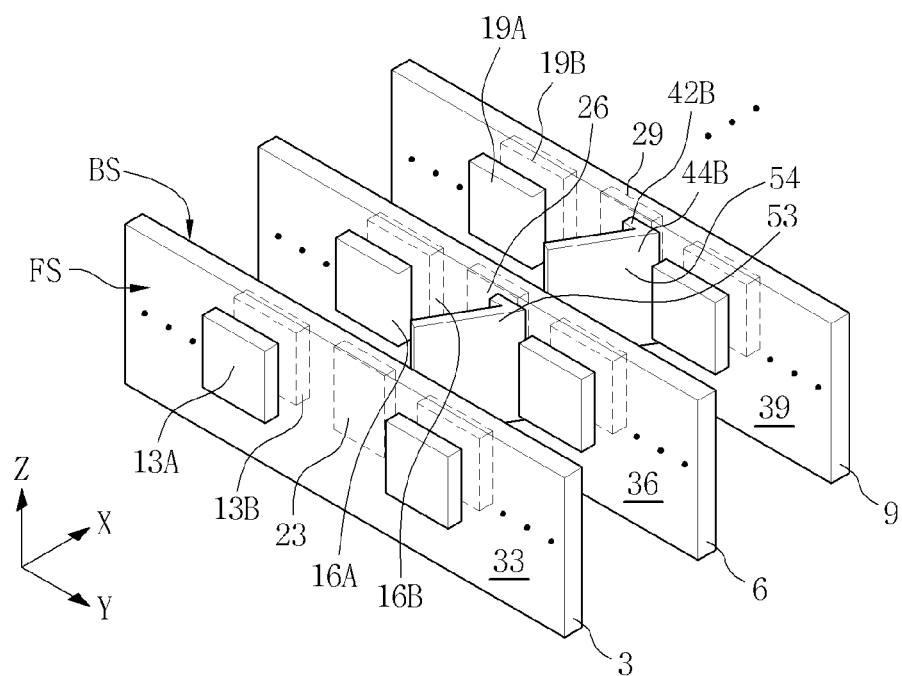
FIG. 3A is a perspective view of a module system according to an exemplary embodiment.
Figure 3B:
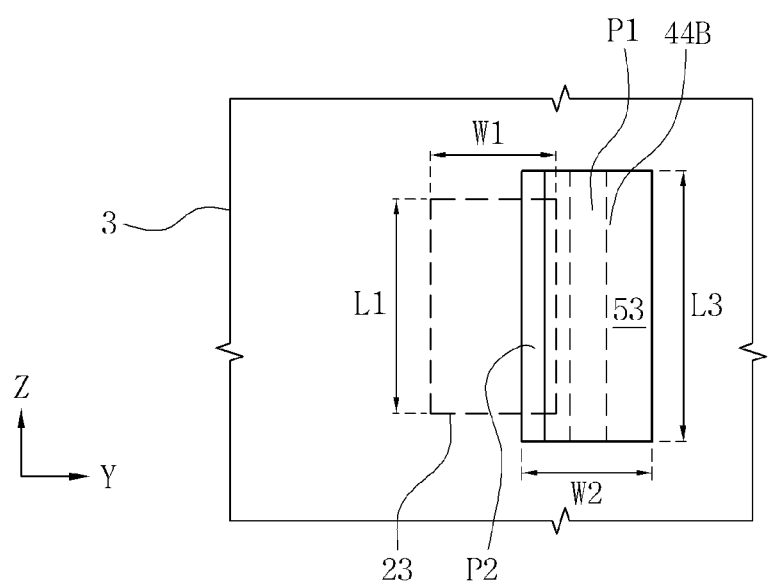
FIG. 3B is a schematic view illustrating a positional relationship of a module substrate, a register and an airflow guide when viewed in an X-direction of FIG. 3A.

FIGS. 3A and 3B illustrate an exemplary embodiment. In FIGS. 3A and 3B, the same members as in FIG. 2A to 2F will be denoted by the same reference numerals as in FIG. 2A to 2F.

FIG. 3A is a perspective view of a module system according to an exemplary embodiment, and FIG. 3B is a schematic view illustrating a positional relationship of a module substrate, a register and an airflow guide when viewed from an X-direction of FIG. 3A.

Referring to FIG. 3A, a module system 143 according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A and 19B disposed on front surfaces FS and back surfaces BS of the first to third module substrates 3, 6 and 9.

The first to third semiconductor modules 33, 36 and 39 may further include first to third registers 23, 26 and 29 disposed on the back surfaces BS of the first to third module substrates 3, 6 and 9, and airflow guides 53 and 54 disposed on the front surfaces FS of the second and third module substrates 6 and 9. Here, the airflow guides 53 and 54 may be substituted for the airflow guides 51 and 52 on the second and third module substrates 6 and 9 in FIG. 2A.

The airflow guides 53 and 54 may have the same shape. The airflow guides 53 and 54 may have a similar shape to the airflow guides 51 and 52 of FIG. 2A. Each of the airflow guides 53 and 54 may include a pedestal 42B and a plate 44B.

Referring to FIGS. 3A and 3B, the airflow guides 53 and 54 may have a different length from the airflow guides 51 and 52 of FIG. 2A in a Z-direction. In more detail, the airflow guide 53 may have a third length L3 that is greater than a first length L1 of the first register 23.

FIGS. 4A to 4D illustrate an exemplary embodiment. In FIGS. 4A to 4D, the same members as in FIG. 2A to 2F will be denoted by the same reference numerals as in FIG. 2A to 2F.

Figure 4A:
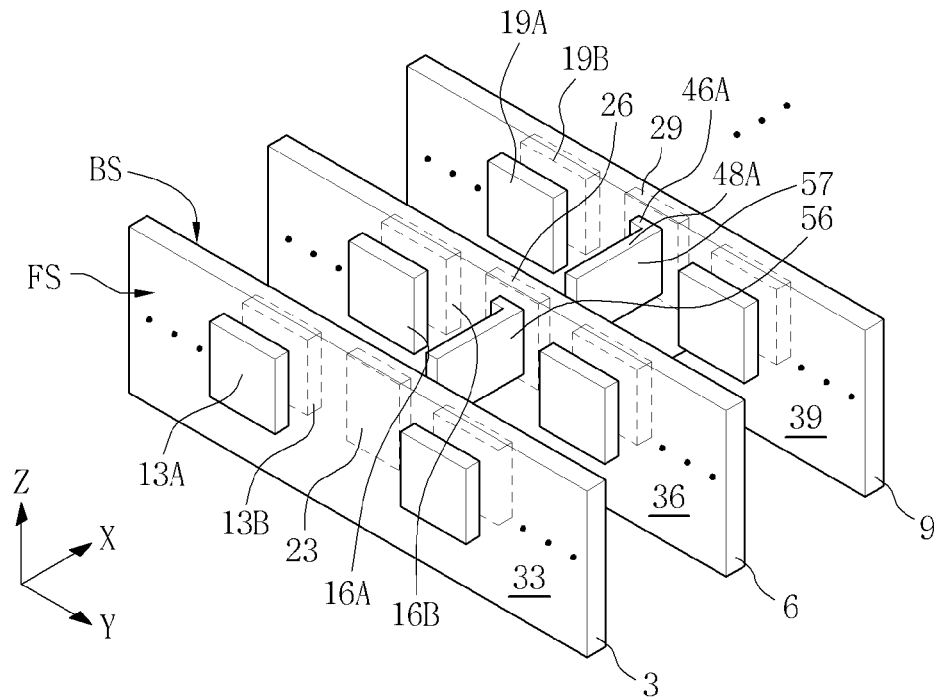
FIG. 4A is a perspective view of a module system according to an exemplary embodiment.
Figure 4B:
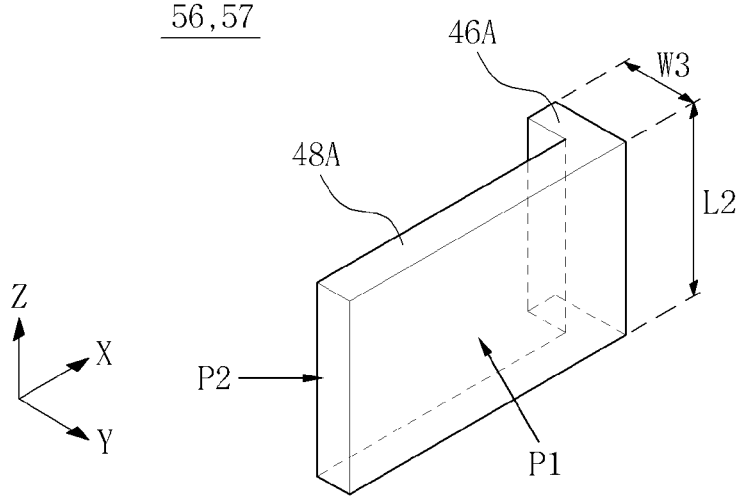
FIG. 4B is a perspective view of an airflow guide of FIG. 4A.

FIG. 4A is a perspective view of a module system according to an exemplary embodiment, and FIG. 4B is a perspective view of an airflow guide of FIG. 4A.

Referring to FIG. 4A, a module system 144 according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A and 19B disposed on front surfaces FS and back surfaces BS of the first to third module substrates 3, 6 and 9.

The first to third semiconductor modules 33, 36 and 39 may further include first to third registers 23, 26 and 29 disposed on the back surfaces BS of the first to third module substrates 3, 6 and 9, and airflow guides 56 and 57 disposed on the front surfaces FS of the second and third module surfaces 6 and 9. The airflow guides 56 and 57 may be substituted for the airflow guides 51 and 52 on the second and third module substrates 6 and 9 in FIG. 2A.

The airflow guides 56 and 57 may have the same shape. The airflow guides 56 and 57 may have a similar shape to the airflow guides 51, 52, 53 and 54 of FIGS. 2A and 3A.

Referring to FIGS. 4A and 4B, each of the airflow guides 56 and 57 may have a pedestal 46A and a plate 48A. The pedestal 46A and the plate 48A may be perpendicular to each other. The pedestal 46A may have a third width W3 in a Y-direction.

The third width W3 may be smaller than the first width W1 of the first register 23. The pedestal 46A and the plate 48A may have a second length L2 in a Z-direction.

Figure 4C:
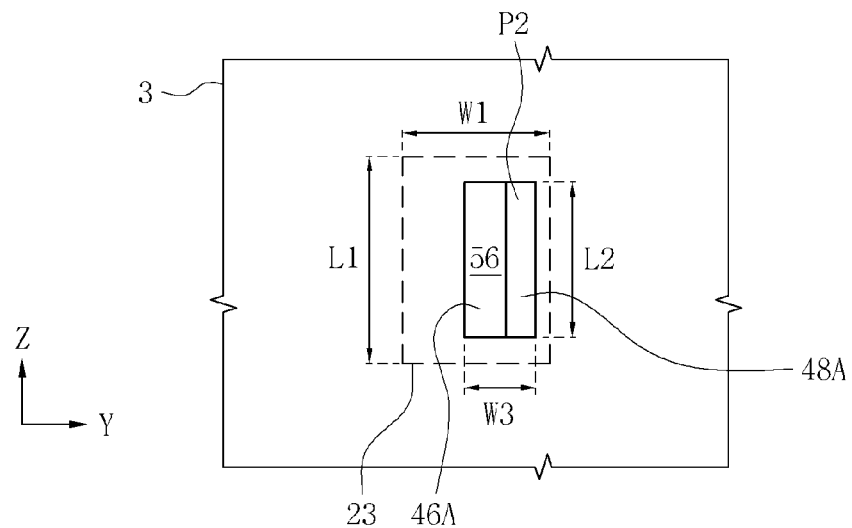
FIG. 4C is a schematic view illustrating a positional relationship of a module substrate, a register and an airflow guide when viewed in an X-direction of FIG. 4A.

FIG. 4C is a schematic view illustrating a positional relationship of a module substrate, a register and an airflow guide when viewed in an X-direction.

Referring to FIG. 4C, when the first module substrate 3 is viewed in an X-direction, the airflow guide 56 may completely overlap the first register 23.

Figure 4D:
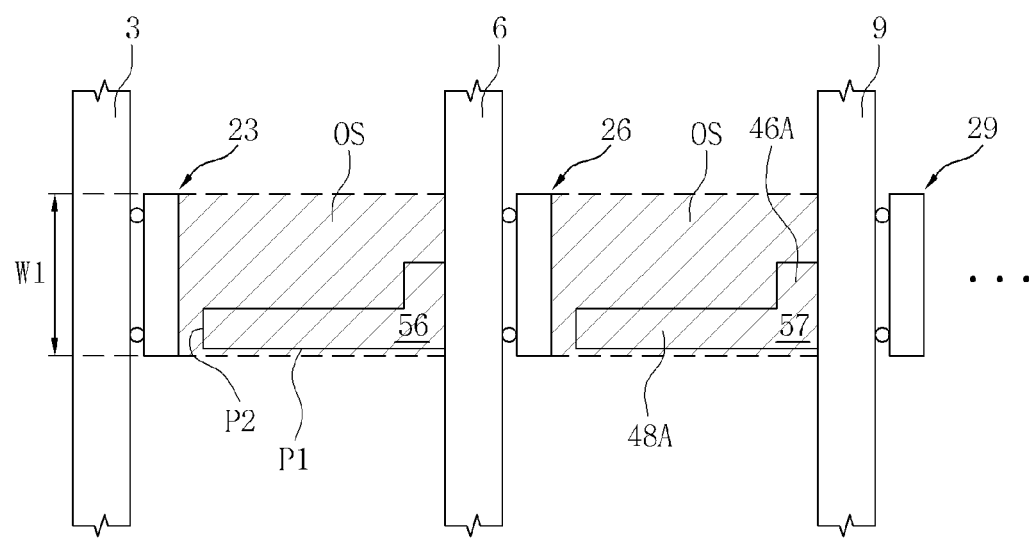
FIG. 4D is a schematic view illustrating a positional relationship of module substrates, registers and airflow guides when viewed in a Z-direction of FIG. 4A.

FIG. 4D is a schematic view illustrating a positional relationship of module substrates, registers and airflow guides when viewed from the Z-direction.

Referring to FIG. 4D, the airflow guides 56 and 57 may be located inside an overlapping space OS, in which the first to third registers 23, 26 and 29 overlap each other.

Figure 5A:
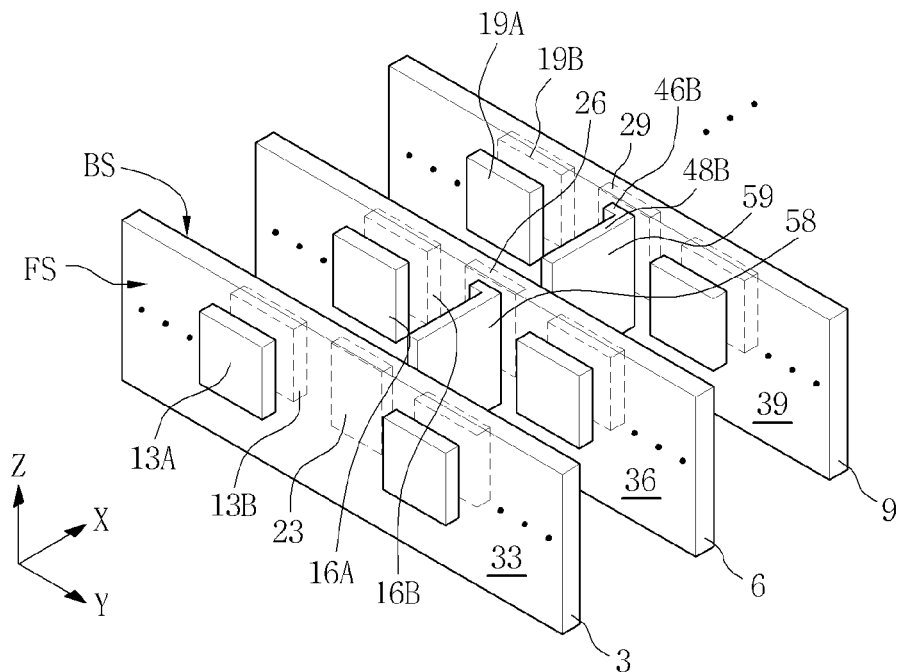
FIG. 5A is a perspective view of a module system according to an exemplary embodiment.
Figure 5B:
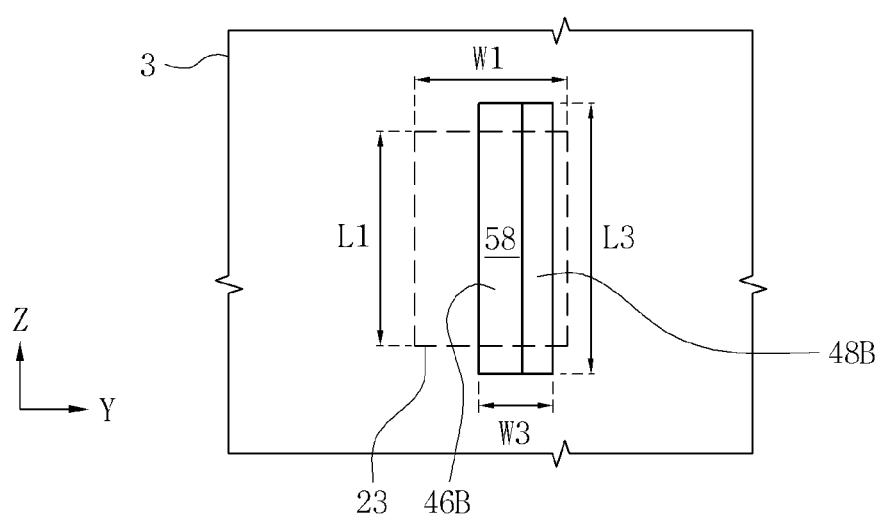
FIG. 5B is a schematic view illustrating a positional relationship of a module substrate, a register and an airflow guide when viewed in an X-direction of FIG. 5A.

FIGS. 5A and 5B illustrate an exemplary embodiment. In FIGS. 5A and 5B, the same members as in FIG. 2A to 2F will be denoted by the same reference numerals as in FIG. 2A to 2F.

FIG. 5A is a perspective view of a module system according to an exemplary embodiment, and FIG. 5B is a schematic view illustrating a positional relationship of a module substrate, a register and an airflow guide when viewed from the X-direction of FIG. 5A.

Referring to FIG. 5A, a module system 145 according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A and 19B disposed on front surfaces FS and back surfaces BS of the first to third module substrates 3, 6 and 9.

The first to third semiconductor modules 33, 36 and 39 may further include first to third registers 23, 26 and 29 disposed on the back surfaces BS of the first to third module substrates 3, 6 and 9, and airflow guides 58 and 59 disposed on the front surfaces FS of the second and third module substrates 6 and 9. The airflow guides 58 and 59 may be substituted for the airflow guides 56 and 57 of FIG. 4A on the first to third module substrates 3, 6 and 9.

The airflow guides 58 and 59 may have the same shape as each other. The airflow guides 58 and 59 may have a similar shape to the airflow guides 56 and 57 of FIG. 4A. Each of the airflow guides 58 and 59 may include a pedestal 46B and a plate 48B.

Referring to FIGS. 5A and 5B, when the first module substrate 3 is viewed from the X-direction of FIG. 5A, the airflow guide 58 may have the same width W3 as the airflow guide 56 in a Y-direction as shown in FIG. 5B. The airflow guide 58 may have a different width from the airflow guide 56 in a Z-direction as shown in FIG. 5B.

The airflow guide 58 may have a third length L3 in the Z-direction. The third length L3 may be greater than a first length L1 of the first register 23.

Figure 6A:
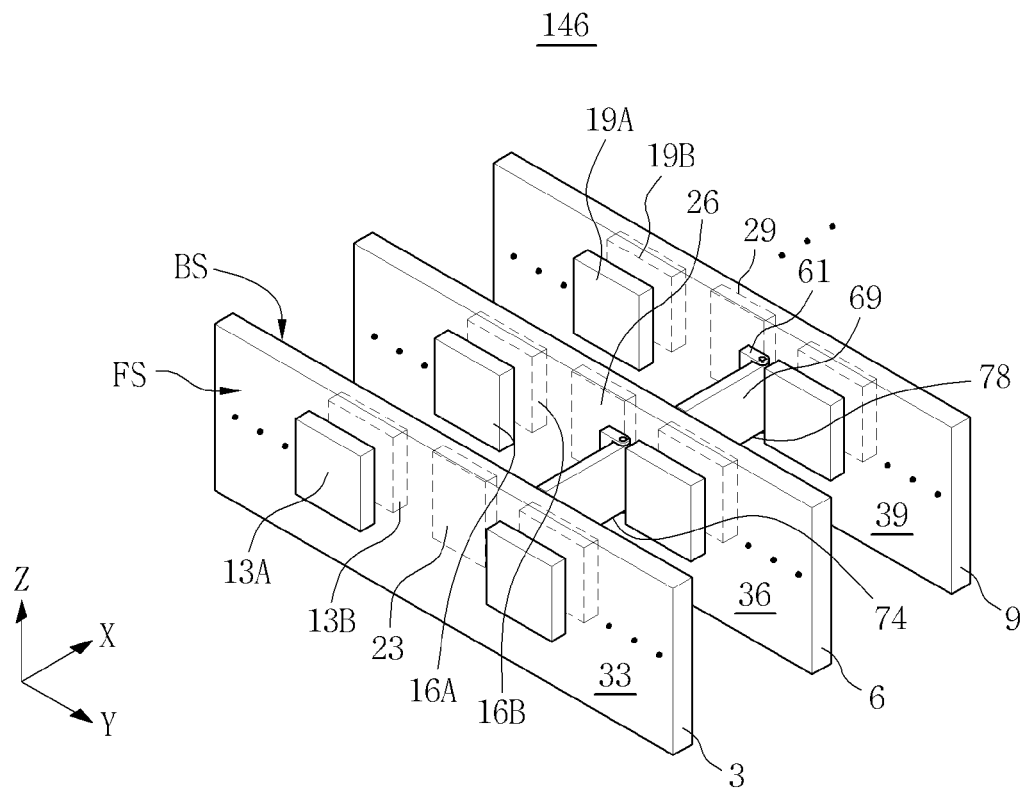
FIG. 6A is a perspective view of a module system according to an exemplary embodiment.
Figure 6B:
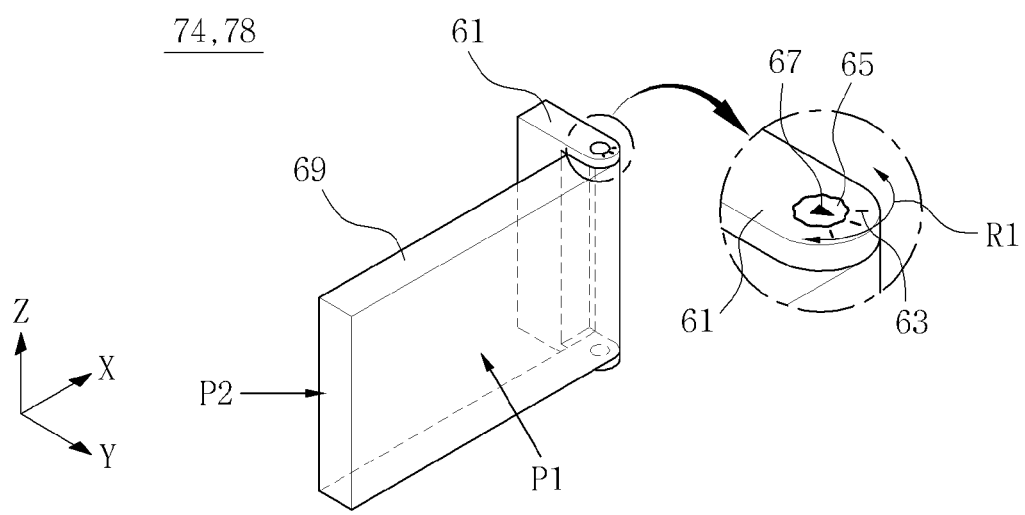
FIG. 6B is a perspective view of an airflow guide of FIG. 6A.
Figure 6C:
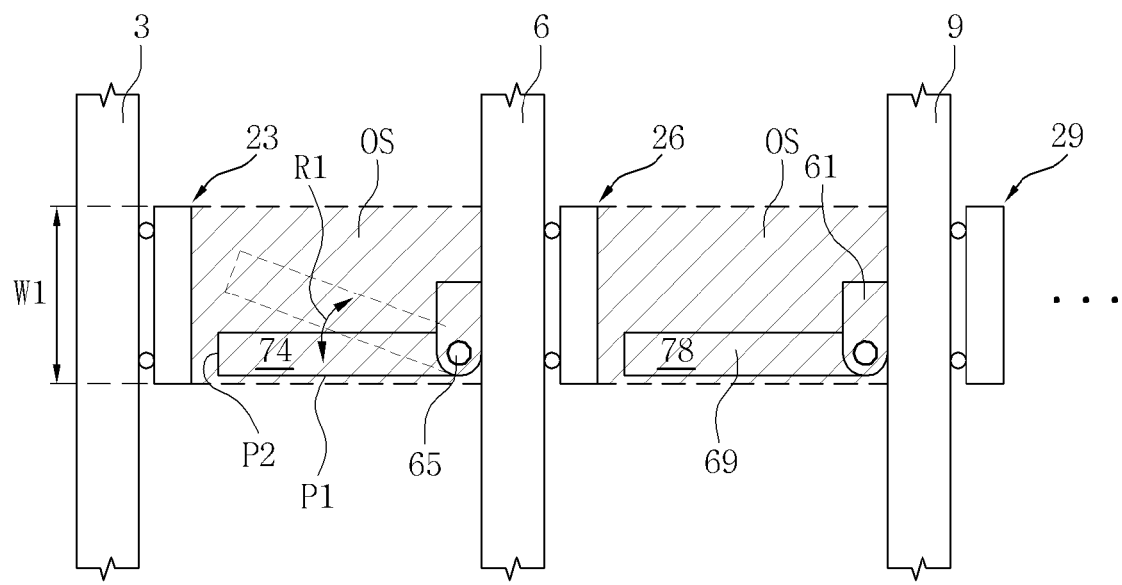
FIG. 6C is a schematic view illustrating a positional relationship of module substrates, registers and airflow guides when viewed in a Z-direction of FIG. 6A.

FIGS. 6A to 6C illustrate an exemplary embodiment. In FIGS. 6A to 6C, the same members as in FIG. 2A to 2F will be denoted by the same reference numerals as in FIG. 2A to 2F.

FIG. 6A is a perspective view of a module system according to an exemplary embodiment.

Referring to FIG. 6A, a module system 146 according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A and 19B disposed on front surfaces FS and back surfaces BS of the first to third module substrates 3, 6 and 9.

The first to third semiconductor modules 33, 36 and 39 may further include first to third registers 23, 26 and 29 disposed on the back surfaces BS of the first to third module substrates 3, 6 and 9, and airflow guides 74 and 78 disposed on the front surfaces FS of the second and third surfaces 6 and 9. The airflow guides 74 and 78 may be substituted for the airflow guides 51 and 52 on the second and third module substrates 6 and 9 in FIG. 2A.

The airflow guides 74 and 78 may have the same shape as each other. Each of the airflow guides 74 and 78 may have a pedestal 61 and a plate 69. The pedestal 61 may be fixed to the front surface FS of the second module substrate 6 or the third module substrate 9.

A first end portion of the plate 69 may be located on a side surface of the pedestal 61, and the plate 69 may rotate using the first end portion thereof. Here, the pedestal 61 and the plate 69 may embody a shape of the airflow guides 51 and 52 of FIG. 2A or the airflow guides 56 and 57 of FIG. 4A between the first to third module substrates 3, 6 and 9.

FIG. 6B is a perspective view of an airflow guide of FIG. 6A.

Referring to FIG. 6B, each of the airflow guides 74 and 78 may include the pedestal 61, an axis of rotation 65 and the plate 69. The pedestal 61 may have the same length as the pedestal 42A of FIG. 2A in a Z-direction. The pedestal 61 may partially cover a side surface of the plate 69. The pedestal 61 may have a rotation scale 63 adjacent to the plate 69 on one or more side portions thereof The axis of rotation 65 may be located inside the side portions of the pedestal 61 and may be attached to the pedestal 61 and the plate 69. The axis of rotation 65 may penetrate the side portions of the pedestal 61 and be inserted into the plate 69 through both sidewalls of the plate 69. Conversely, the axis of rotation 65 may protrude from the sidewalls of the plate 69 and combine with the side portions of the pedestal 61.

The axis of rotation 65 may engage with the pedestal 61. Each of the axes of rotation 65 may include a rotation adjuster 67. The rotation adjuster 67 may move along the rotation scale 63 using the axes of rotation 65. The plate 69 may be partially inserted into one side portion of the pedestal 61.

The plate 69 may rotate in the first rotation direction R1. The plate 69 may include a guiding surface P1 and a leading surface P2. The guiding surface P1 and the leading surface P2 may have the same function as the guiding surface P1 and the leading surface P2 of FIG. 2A. The guiding surface P1 may be flat.

FIG. 6C is a schematic view illustrating a positional relationship of module substrates, registers and airflow guides when viewed from the Z-direction of FIG. 6A.

Referring to FIG. 6C, when the first to third module substrates 3, 6 and 9 are viewed from the Z-direction (or an upper portion), the airflow guides 74 and 78 may be located inside overlapping spaces OS of the first to third registers 23, 26 and 29. The plate 69 may rotate in the first rotation direction R1.

Here, the leading surface P2 of the plate 69 may align with an upper portion of the first register 23 or the second register 26, or may be located on the first register 23 or the second register 26.

FIGS. 7A to 7D illustrate an exemplary embodiment. In FIGS. 7A to 7D, the same members as in FIG. 2A to 2F will be denoted by the same reference numerals as in FIG. 2A to 2F.

Figure 7A:
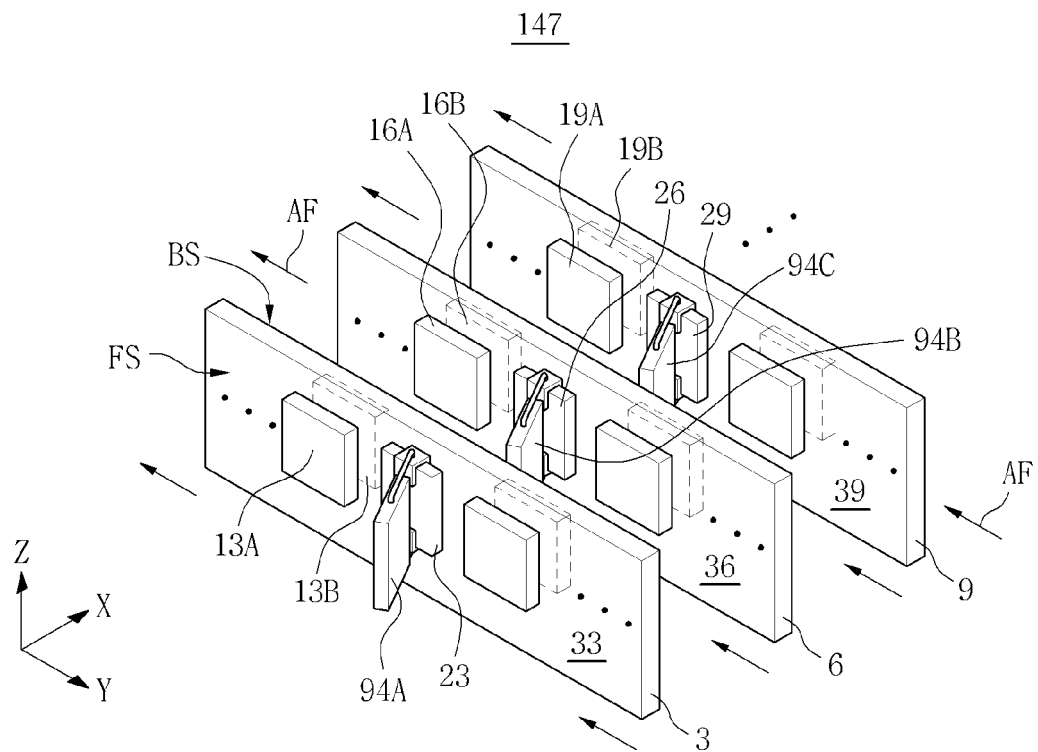
FIG. 7A is a perspective view of a module system and an airflow in the module system according to an exemplary embodiment.

FIG. 7A is a perspective view of a module system and an airflow in the module system according to an exemplary embodiment.

Referring to FIG. 7A, a module system 147 according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A and 19B disposed on front surfaces FS and back surfaces BS of the first to third module substrates 3, 6 and 9.

The first to third semiconductor modules 33, 36 and 39 may further include first to third registers 23, 26 and 29 disposed on the front surface FS of the first to third module substrates 3, 6 and 9, and airflow guides 94A, 94B and 94C disposed on the first to third registers 23, 26 and 29.

The first to third registers 23, 26 and 29 may also be disposed on the back surface BS of the first to third module substrates 3, 6 and 9. The airflow guides 94A, 94B and 94C may have the same shape as each other. Meanwhile, during the electronic system 160 is being driven, the electronic system 160 may cause air to flow around a periphery of the first semiconductor module 33 and between the first to third semiconductor modules 33, 36 and 39.

The air may flow in an airflow AF at the periphery of the first semiconductor module 33 and between the first to third semiconductor modules 33, 36 and 39. The air may lower a temperature of the first to third registers 23, 26 and 29 and the first to third memory devices 13A, 13B, 16A, 16B, 19A and 19B.

Figure 7B:
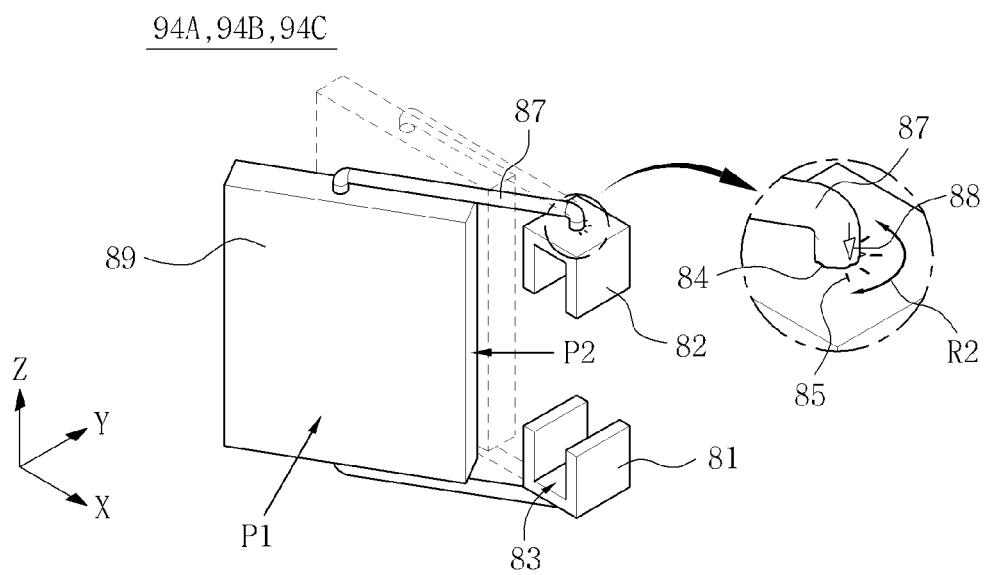
FIG. 7B is a perspective view of an airflow guide of FIG. 7A.

FIG. 7B is a perspective view of an airflow guide of FIG. 7A.

Referring to FIG. 7B, each of the airflow guides 94A, 94B and 94C may include first and second pedestals 81 and 82, first and second supporters 87, and a plate 89. The first and second pedestals 81 and 82 may be disposed to face each other in a Z-direction. The first and second pedestals 81 and 82 may have a mount leading holes 83 of a clamper shape, a horseshoe shape or a shape of a letter 'U', respectively.

The first and second pedestals 81 and 82 may be in contact with the first to third registers 23, 26 and 29 of FIG. 7A or may be fitted in side portions of the first to third registers 23, 26 and 29 using the mount leading holes 83. The first and second pedestals 81 and 82 may have rotation leading holes 84, respectively.

The rotation leading holes 84 may be horizontally formed from an outer sidewall of the first and second pedestals 81 and 82 toward the mount leading holes 83, in the Z-direction. The first and second pedestals 81 and 82 may have rotation scales 85 around the rotation leading holes 84. The first and second supporters 87 may be in contact with the first and second pedestals 81 and 82, and the plate 89.

One end portions of the first and second supporters 87 may be inserted into the rotation leading holes 84, respectively and may engage with the rotation leading holes 84. The other end portions of the first and second supporters 87 may be fixed to the sidewalls of the plate 89, respectively. Each of the first and second supporters 87 may have a rotation adjuster 88 around each of the first and second pedestals 81 and 82.

The plate 89 may be located between the first and second supporters 87. The plate 89 may be rotated in a second rotation direction R2 using the first and second supporters 87 with respect to the first and second pedestals 81 and 82. The plate 89 may be rotated to an angle between about 45° and about 90° with respect to the first to third module substrates 3, 6 and 9, the first to third registers 23, 26 and 29, or the first and second pedestals 81 and 82.

The plate 89 may include a guiding surface P1 and a leading surface P2. The guiding surface P1 and the leading surface P2 may be as illustrated in FIG. 2C. The guiding surface P1 may be flat. The plate 89 may have a shape indicated by a solid line that is not rotated with respect to the first and second pedestals 81 and 82, or a shape indicated by a dotted line that is rotated with respect to the first and second pedestals 81 and 82.

Here, the plate 89 may be obliquely inclined with respect to the first to third module substrates 3, 6 and 9, the first to third registers 23, 26 and 29, or the first and second pedestals 81 and 82 in the shape indicated by a solid line. Also, the plate 89 may be perpendicular with respect to the first to third module substrates 3, 6 and 9, the first to third registers 23, 26 and 29, or the first and second pedestals 81 and 82 in the shape indicated by a dotted line.

Figure 7C:
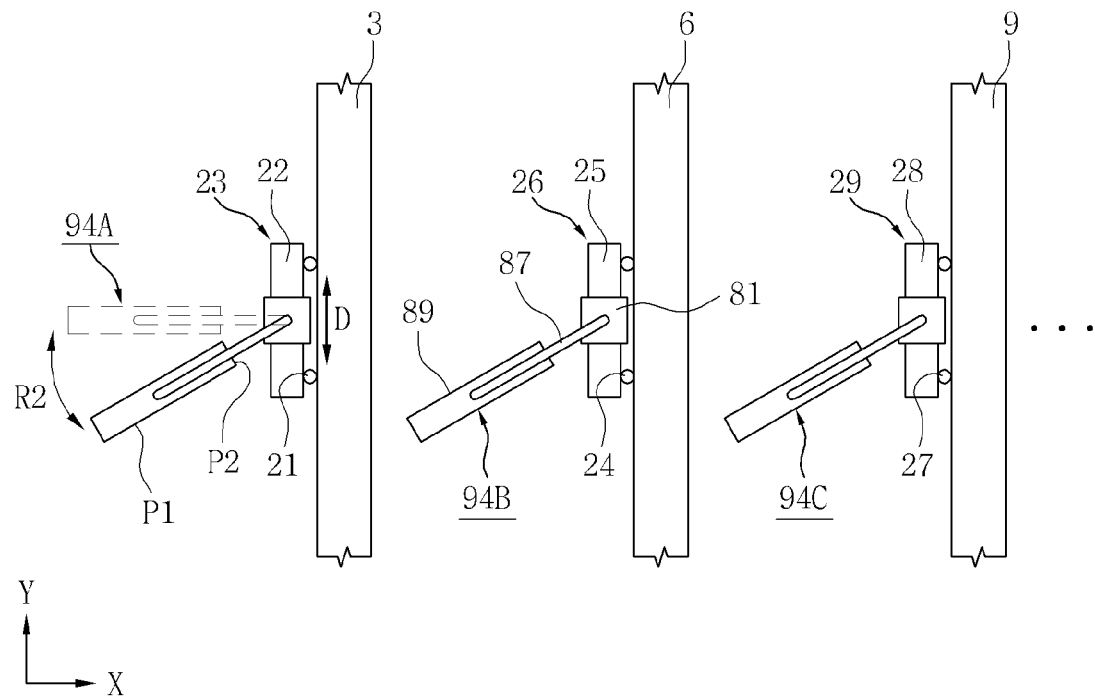
FIG. 7C is a schematic view illustrating a positional relationship of module substrates, registers and airflow guides when viewed in a Z-direction of FIG. 7A.

FIG. 7C is a schematic view illustrating a positional relationship of module substrates, registers and airflow guides when viewed in a Z-direction of FIG. 7A.

Referring to FIG. 7C, when the first to third module substrates 3, 6 and 9 are viewed from the Z-direction (an upper portion) of FIG. 7A, each of the airflow guides 94A, 94B and 94C may include the pedestal 81, the supporter 87 and the plate 89. The pedestal 81 may be fitted in a side portion of each of the first to third registers 23, 26 and 29.

The pedestal 81 may move in a parallel direction D with respect to the first to third module substrates 3, 6 and 9 in the side portion of each of the first to third registers 23, 26 and 29. The supporter 87 may protrude from the pedestal 81 and support the plate 89. The plate 89 may be fixed to the supporter 87 and located on the first, second or third register 23, 26 or 29.

The plate 89 may rotate in the second rotation direction R2 with respect to the pedestal 81 using the supporter 87. Here, the leading surface P2 of the plate 89 may be located closer to the first, second or third register 23, 26 or 29 compared to the guiding surface P1 and aligned with or located on the first, second or third register 23, 26 or 29.

Figure 7D:
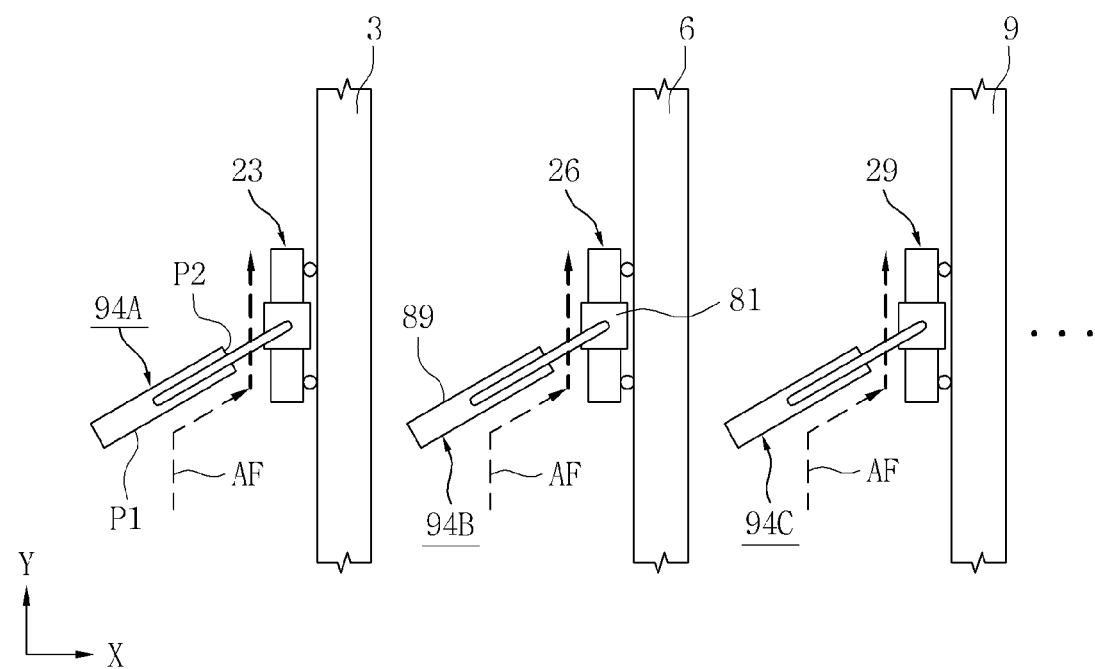
FIG. 7D is a schematic view illustrating an airflow in a module system in more detail when viewed in a Z-direction of FIG. 7A.

FIG. 7D is a schematic view illustrating an airflow in a module system in more detail when viewed in a Z-direction of FIG. 7A.

Referring to FIG. 7D, on the first to third module substrates 3, 6 and 9, a direction of movement of the airflow AF of FIG. 7A may be shifted by the airflow guides 94A, 94B and 94C. The airflow guides 94A, 94B and 94C may partially block regions between the first to third module substrates 3, 6 and 9.

Each of the airflow guides 94A, 94B and 94C may include the guiding surface P1 and the leading surface P2. The airflow AF may be in contact with and flow along the guiding surface P1. The airflow AF may flow heavily into from a periphery of the leading surface P2 toward the first register 23, the second register 26 or the third register 29.

In more detail, the airflow AF may flow between the first register 23 and the plate 89 around the leading surface P2 on the first module substrate 3. The airflow AF may flow between the second register 26 and the plate 89 in a region confined to the first and second module substrates 3 and 6.

Further, the airflow AF may flow between the third register 29 and the plate 89 in a region confined to the second and third module substrates 6 and 9. The air may lower a temperature of the first register 23, the second register 26 or the third register 29 around the leading surface P2

Figure 8A:
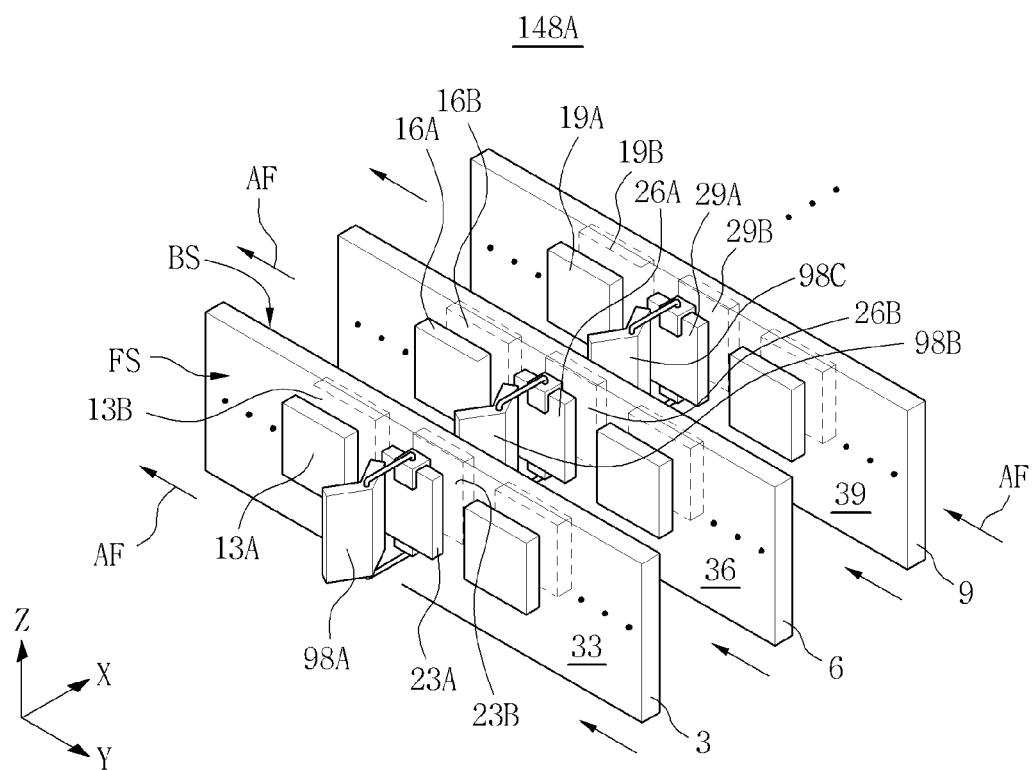
FIG. 8A is a perspective view of a module system and an airflow in the module system according to an exemplary embodiment.
Figure 8B:
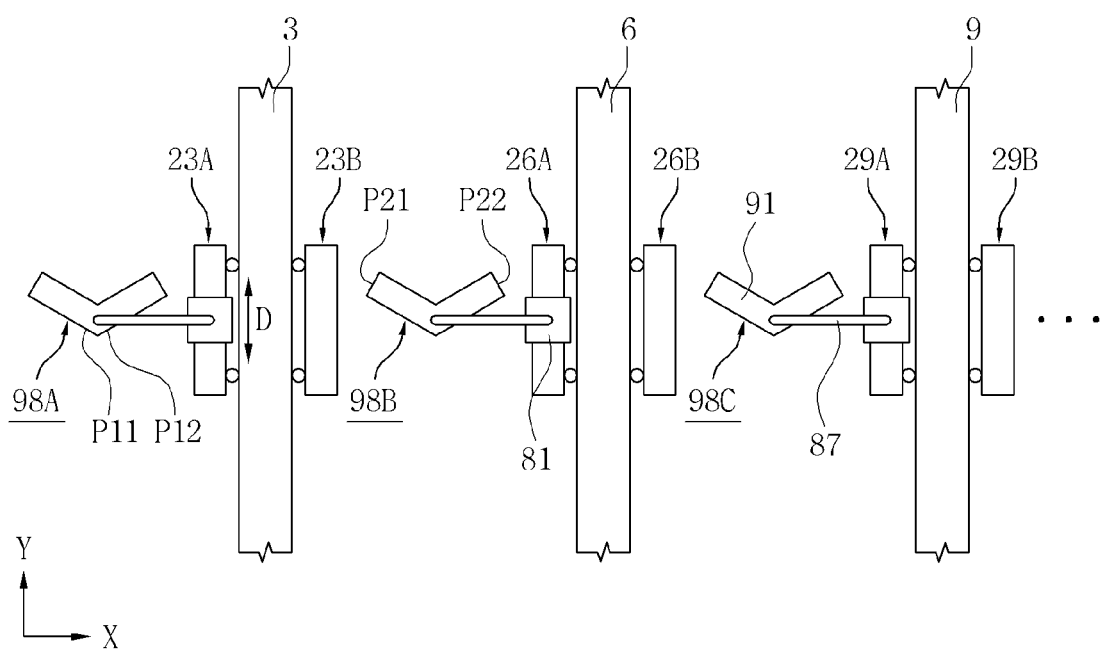
FIG. 8B is a schematic view illustrating a positional relationship of module substrates, registers and airflow guides when viewed in a Z-direction of FIG. 8A.
Figure 8C:
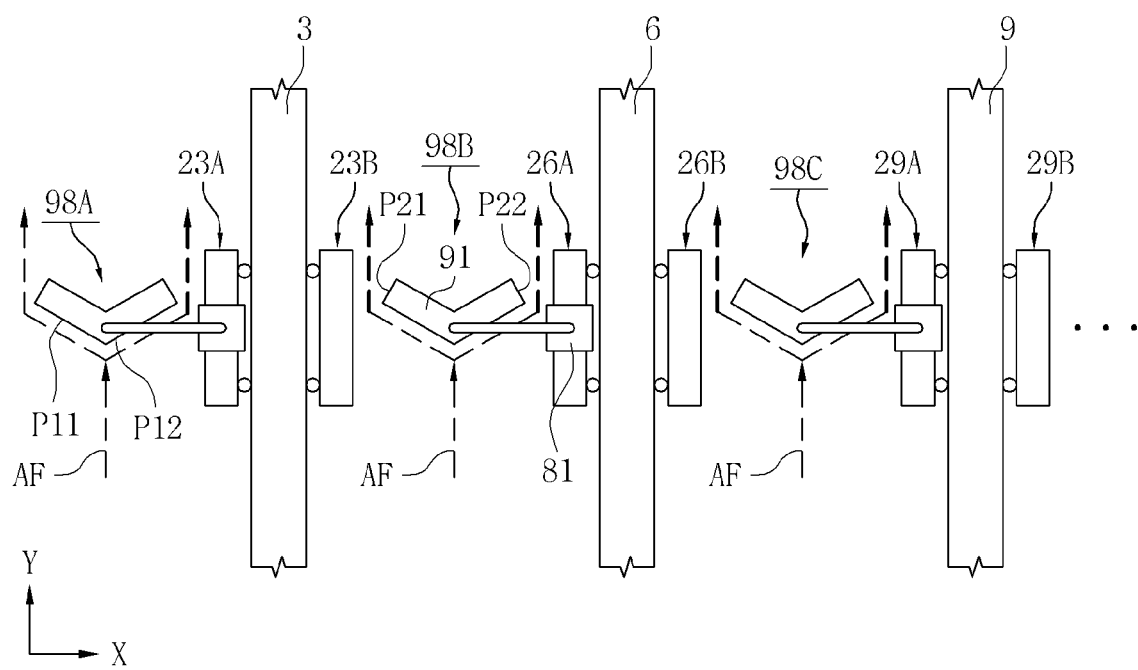
FIG. 8C is a schematic view illustrating an airflow in a module system in more detail when viewed in a Z-direction of FIG. 8A.

FIGS. 8A to 8C illustrate an exemplary embodiment. In FIGS. 8A to 8D, the same members as in FIG. 2A to 2F will be denoted by the same reference numerals as in FIG. 2A to 2F.

FIG. 8A is a perspective view of a module system and an airflow in the module system according to an exemplary embodiment.

Referring to FIG. 8A, a module system 148A according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A and 19B disposed on front surfaces FS and back surfaces BS of the first to third module substrates 3, 6 and 9.

The first to third semiconductor modules 33, 36 and 39 may further include first to third registers 23A, 23B, 26A, 26B, 29A and 29B disposed on the front surfaces FS and the back surfaces BS of the first and third module substrates 3, 6 and 9, and airflow guides 98A, 98B and 98C disposed on the first to third registers 23A, 26A and 29A.

The airflow guides 98A, 98B and 98C may have the same shape as each other. The airflow guides 98A, 98B and 98C may also be disposed on the first to third registers 23B, 26B and 29B. The airflow guides 98A, 98B and 98C may have a similar shape to the airflow guides 94A, 94B and 94C of FIG. 7A.

The airflow guides 98A, 98B and 98C may be substituted for the airflow guides 94A, 94B and 94C of FIG. 7A. Meanwhile, while the electronic system 160 is being driven, the electronic system 160 may cause air to flow around a periphery of the first semiconductor module 33, and between the first to third semiconductor modules 33, 36 and 39.

Thus, the air may flow in an airflow AF at the periphery of the first semiconductor module 33, and between the first to third semiconductor modules 33, 36 and 39. The air may lower a temperature of part of the first to third registers 23A, 23B, 26A, 26B, 29A and 29B, and the first to third memory devices 13A, 13B, 16A, 16B, 19A and 19B.

FIG. 8B is a schematic view illustrating a positional relationship of module substrates, registers and airflow guides when viewed from the Z-direction of FIG. 8A.

Referring to FIG. 8B, when the first and third module substrates 3, 6 and 9 are viewed from the Z-direction (or an upper portion) of FIG. 8A, each of the airflow guides 98A, 98B and 98C may include a pedestal 81, a supporter 87 and a plate 91. The pedestal 81 may be as illustrated in FIGS. 7B and 7C. The supporter 87 may be as illustrated in FIG. 7C. The supporter 87 may be fixed to a sidewall of the plate in a central portion of the plate 91.

The supporter 87 may be fixed to the pedestal 81 or may be rotated with respect to the pedestal 81, as shown in FIGS. 7B and 7C. As a simple example, the supporter 87 may be fixed to and perpendicular to the pedestal 81. The plate 91 may have two guiding surfaces P11 and P12, and two leading surfaces P21 and P22. For example, the plate 91 may have a shape of a letter 'V'.

The plate 91 may include an inward guiding surface P12 extending from a center of the plate 91 toward a surface of each of the module surfaces 3, 6 and 9, and an outward guiding surface P11 extending from the center of the plate 91 away from each of the module surfaces 3, 6 and 9. The inward guiding surface P12 may form an angle between about 90 and about 180 with respect to the outward guiding surface P11.

FIG. 8C is a schematic view illustrating an airflow in a module system in more detail when viewed in a Z-direction of FIG. 8A.

Referring to FIG. 8C, a direction of movement of the airflow AF of FIG. 8A may be shifted along the guiding surfaces P11 and P12 of the airflow guides 98A, 98B and 98C. An airflow AF may flow along the guiding surfaces P11 and P12 and the leading surfaces P11 and P12 and be concentrated on the first to third registers 23A, 23B, 26A, 26B, 29A and 29B.

Figure 9A:
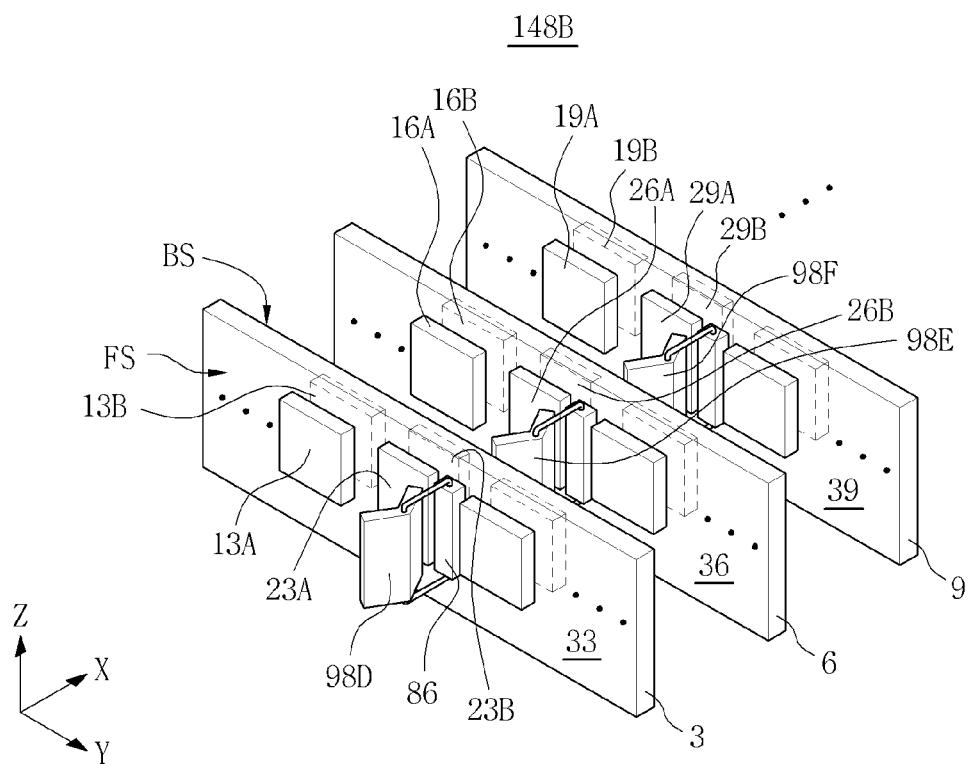
FIG. 9A is a perspective view of a module system according to an exemplary embodiment.
Figure 9B:
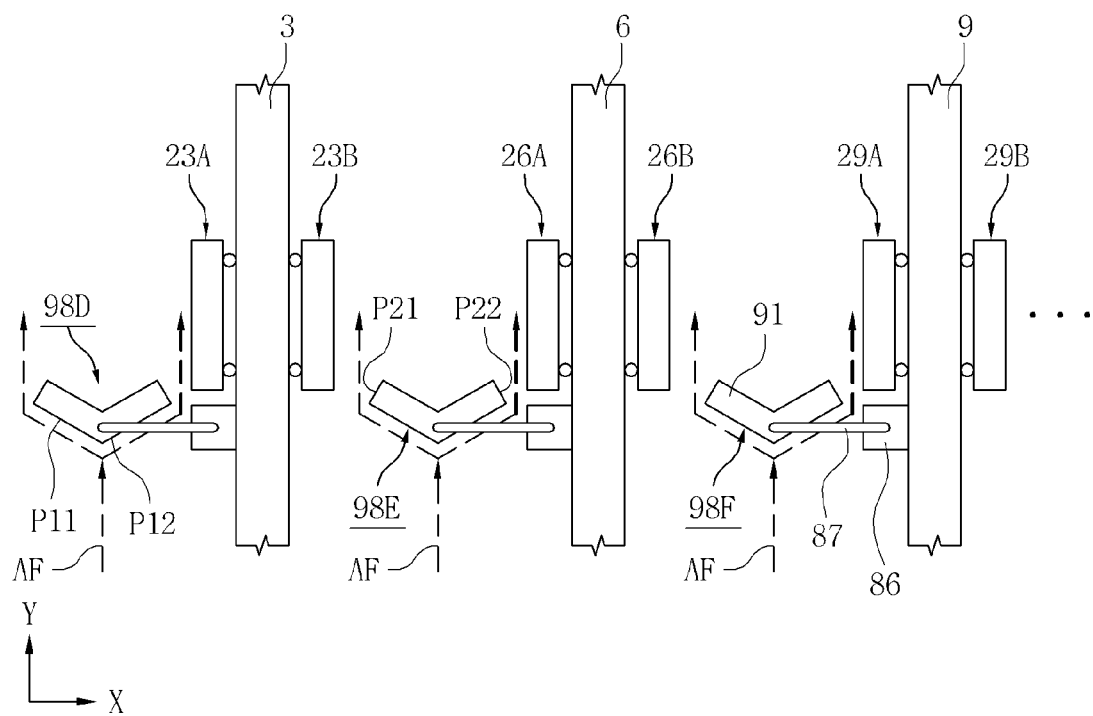
FIG. 9B is a schematic view illustrating a positional relationship of module substrates, registers and airflow guides when viewed in a Z-direction of FIG. 9A.

FIGS. 9A and 9B illustrate an exemplary embodiment. In FIGS. 9A and 9B, the same members as in FIG. 2A to 2F will be denoted by the same reference numerals as in FIG. 2A to 2F.

FIG. 9A is a perspective view of a module system according to an exemplary embodiment.

Referring to FIG. 9A, a module system 148B according to an exemplary embodiment may have the same elements as the module system 148A of FIG. 8A, and a similar arrangement structure to the elements of the module system 148A of FIG. 8A. However, the module system 148B may have airflow guides 98D, 98E and 98F not disposed on the first to third registers 23B, 26B and 29B.

The airflow guides 98D, 98E and 98F may be disposed on front surfaces FS of first to third module substrates 3, 6 and 9. The airflow guides 98D, 98E and 98F may also be disposed on back surfaces BS of first to third module substrates 3, 6 and 9. The airflow guides 98D, 98E and 98F may have a similar shape to the airflow guides 98A, 98B and 98C of FIG. 8A.

Here, the airflow guides 98D, 98E and 98F may include pedestals 86 having a different shape from the airflow guides 98A, 98B and 98C. Each of the pedestals 86 may extend from one side portion of each of the airflow guides 98D, 98E and 98F toward the other side portion thereof in the Z-direction.

FIG. 9B is a schematic view illustrating a positional relationship of module substrates, registers and airflow guides when viewed from the Z-direction of FIG. 9A.

Referring to FIG. 9B, when the first to third module substrates 3, 6 and 9 are viewed from the Z-direction (or an upper portion) of FIG. 9A, the airflow guides 98D, 98E and 98F according to an exemplary embodiment may be directly contacted with the front surfaces FS of the first to third module substrates 3, 6 and 9, respectively. The airflow guides 98D, 98E and 98F may be located in front of the first to third registers 23A, 23B, 26A, 26B, 29A and 29B in a Y-direction.

Meanwhile, while the electronic system 160 is being driven, it may cause air to flow around a periphery of the first module substrate 3, and between the first to third module substrates 3, 6 and 9. The air may flow in an airflow AF at the periphery of the first module substrate 3, and between the first to third module substrates 3, 6 and 9. The airflow AF may be the same as the airflow AF of FIG. 8C.

Figure 10A:
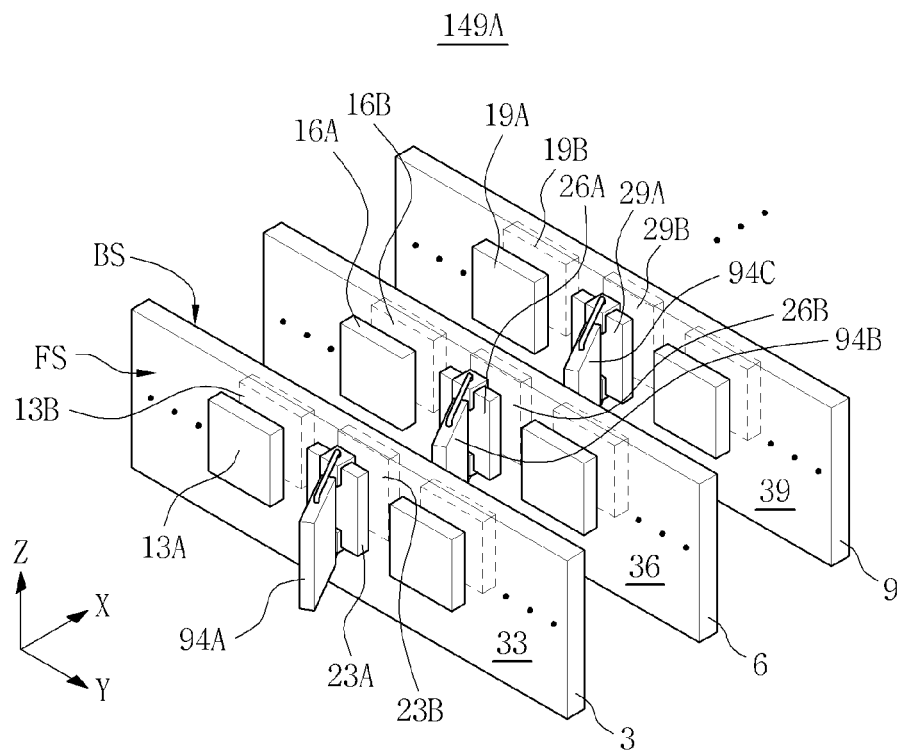
FIG. 10A is a perspective view of a module system according to an exemplary embodiment.
Figure 10B:
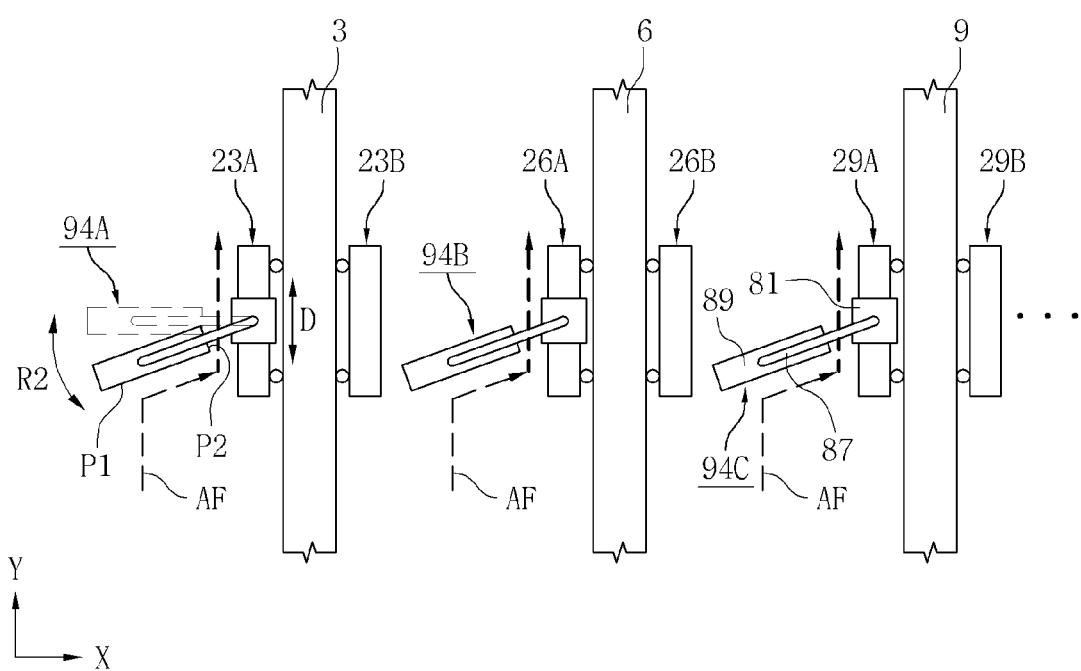
FIG. 10B is a schematic view illustrating a positional relationship of module substrates, registers and airflow guides when viewed in a Z-direction of FIG. 10A.

FIGS. 10A and 10B illustrate an exemplary embodiment. In FIGS. 10A and 10B, the same members as in FIG. 2A to 2F will be denoted by the same reference numerals as in FIG. 2A to 2F.

FIG. 10A is a perspective view of a module system according to an exemplary embodiment.

Referring to FIG. 10A, a module system 149A according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A, and 19B disposed on front surfaces FS and back surfaces BS of the first to third module substrates 3, 6 and 9.

The first to third semiconductor modules 33, 36 and 39 may further include first to third registers 23A, 23B, 26A, 26B, 29A and 29B disposed on the front surfaces FS and the back surfaces BS of the first to third module substrates 3, 6 and 9, and airflow guides 94A, 94B and 94C disposed on the first to third registers 23A, 26A and 29A.

In other exemplary embodiments, the airflow guides 94A, 94B and 94C may also be disposed on the first to third registers 23B, 26B and 29B, which may be disposed on the back surfaces BS of the first to third registers 23A, 26A and 29A.

FIG. 10B is a schematic view illustrating a positional relationship of module substrates, registers and airflow guides when viewed from the Z-direction of FIG. 10A.

Referring to FIG. 10B, when the first to third module substrates 3, 6 and 9 are viewed from the Z-direction (or an upper portion) of FIG. 10A, each of the airflow guides 94A, 94B and 94C may include a pedestal 81, a supporter 87 and a plate 89. The pedestal 81, the supporter 87 and the plate 89 may be illustrated in FIGS. 7B and 7C.

Here, from the viewpoint of the first to third registers 23A, 23B, 26A, 26B, 29A and 29B, the plate 89 may have a guiding surface P1 and a leading surface P2 on the first, second or third register 23A, 26A or 29A of the first, second or third module substrate 3, 6 or 9. Meanwhile, while the electronic system 160 is being driven, the electronic system 160 may cause air to flow around a periphery of the first module substrate 3, and between the first to third module substrates 3, 6 and 9.

The air may flow in an airflow AF at the periphery of the first module substrate 3, and between the first to third module substrates 3, 6 and 9. The airflow AF may be the same as the airflow AF of FIG. 7D. The airflow AF may be similar to the airflow AF of FIG. 8C or 9B.

Figure 11A:
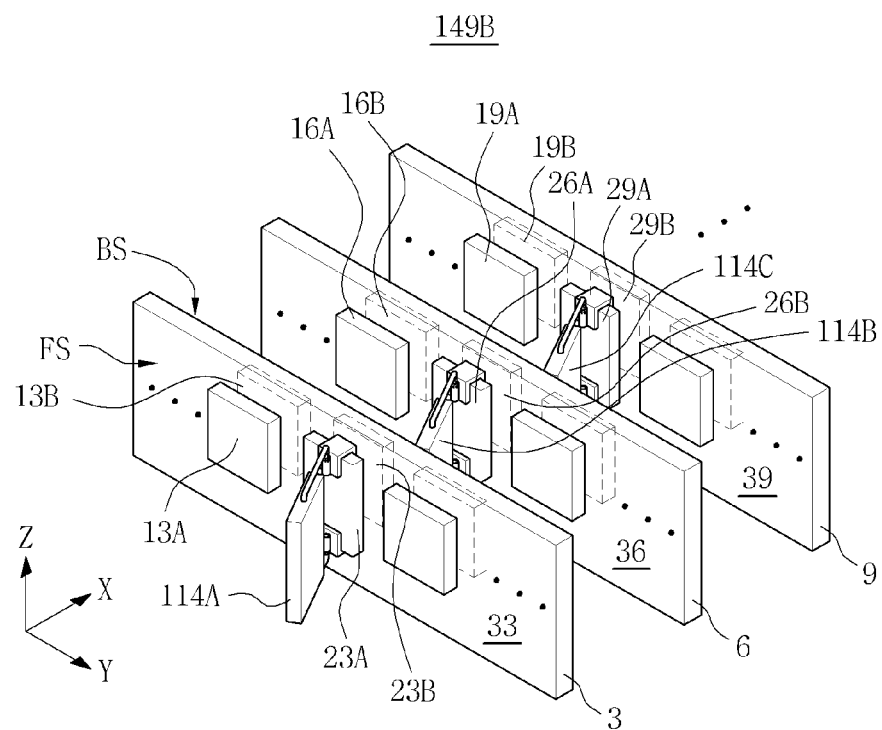
FIG. 11A is a perspective view of a module system according to an exemplary embodiment.
Figure 11B:
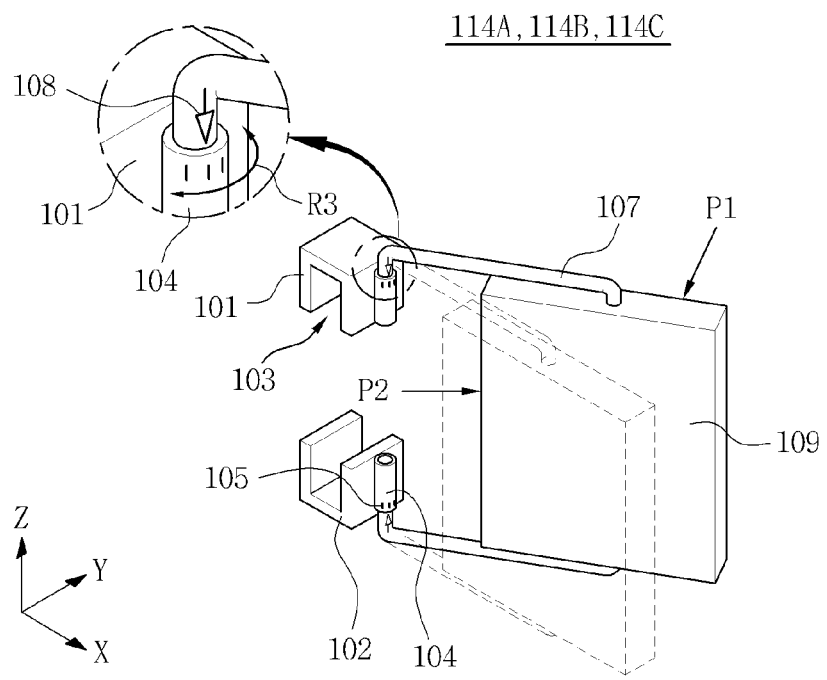
FIG. 11B is a perspective view of an airflow guide of FIG. 11A according to an exemplary embodiment.

FIGS. 11A and 11B illustrate an exemplary embodiment. In FIGS. 11A and 11B, the same members as in FIG. 2A to 2F will be denoted by the same reference numerals as in FIG. 2A to 2F.

FIG. 11A is a perspective view of a module system according to an exemplary embodiment Referring to FIG. 11A, a module system 149B according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A, and 19B disposed on front surfaces FS and back surfaces BS of the first to third module substrates 3, 6 and 9.

The first to third semiconductor modules 33, 36 and 39 may further include first to third registers 23A, 23B, 26A, 26B, 29A and 29B disposed on the front surfaces FS and the back surfaces BS of the first to third module substrates 3, 6 and 9, and airflow guides 114A, 114B and 114C disposed on the first to third registers 23A, 26A and 29A.

The airflow guides 114A, 114B and 114C may have a similar shape to the airflow guides 94A, 94B and 94C of FIG. 7A, or the airflow guides 98A, 98B and 98C of FIG. 8A. The airflow guides 114A, 114B and 114C may be fitted in side portions of the first to third registers 23A, 26A and 29A, similarly to the airflow guides 94A, 94B and 94C of FIG. 7A, or the airflow guides 98A, 98B and 98C of FIG. 8A.

In other exemplary embodiments, the airflow guides 114A, 114B and 114C may also be disposed on top surfaces of the first to third registers 23B, 26B and 29B, which may be disposed on the back surfaces BS of the first to third module substrates 3, 6 and 9.

FIG. 11B is a perspective view of an airflow guide of FIG. 11A according to an exemplary embodiment.

Referring to FIG. 11B, each of the airflow guides 114A, 114B and 114C according to an exemplary embodiment may include first and second pedestals 101 and 102, rotation leading tubes 104, supporters 107 and a plate 109. The first and second pedestals 101 and 102 may have the same shape as the first and second pedestals 81 and 82 of FIG. 7B.

The first and second pedestals 101 and 102 may respectively have mount leading holes 103 of a clamper shape, a horse shape or a shape of a letter 'U', similarly to the first and second pedestals 81 and 82 of FIG. 7B. The rotation leading tubes 104 may be disposed on the first and second pedestals 101 and 102. Each of the rotation leading tubes 104 may have a rotation scale 105.

The supporters 107 may have the same shape as the supporters 87 of FIG. 7B. One end portions of the supporters 107 may be inserted into the rotation leading tubes 104, respectively. The supporters 107 may be rotated in a third rotation R3. The supporters 107 may respectively have rotation adjusters 108 around the first and second pedestals 108.

The other end portions of the supporters 107 may be inserted into or fixed to both sidewalls of the plate 109. The plate 109 may be rotated in an angle between about 45° and about 90° with respect to the rotation leading tubes 104.

Figure 12A:
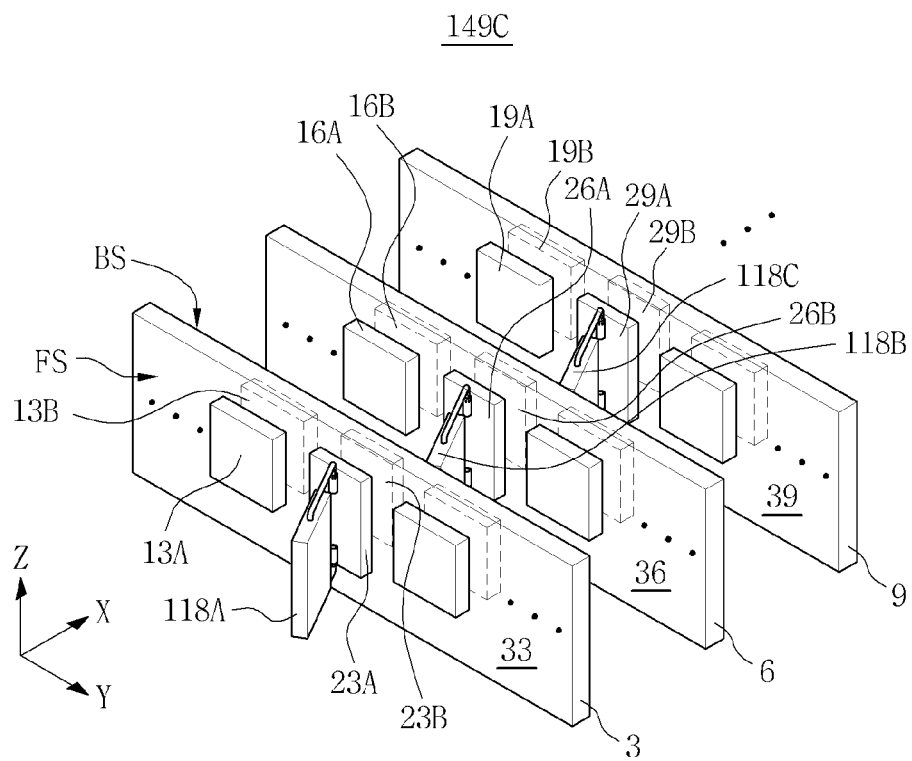
FIG. 12A is a perspective view of a module system according to an exemplary embodiment.
Figure 12B:
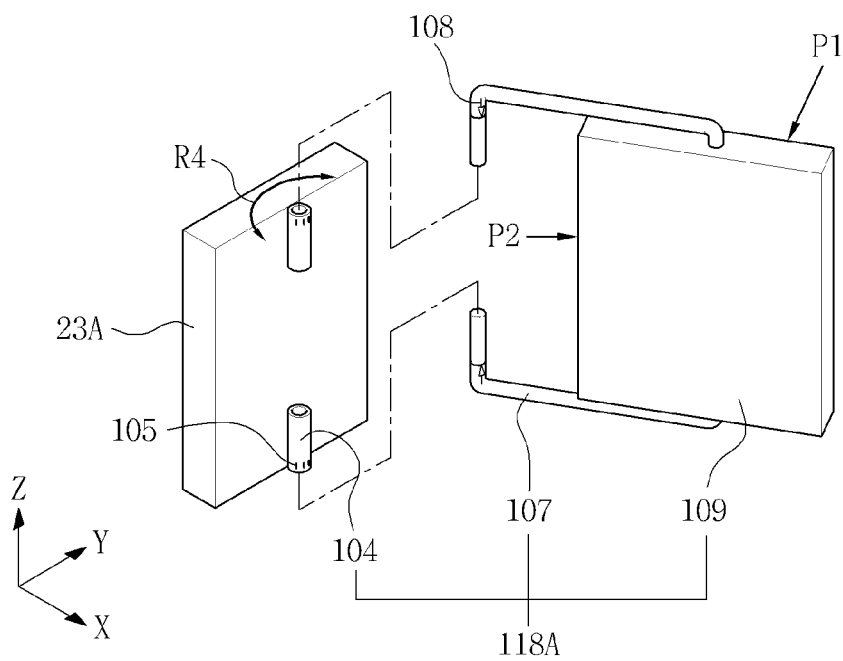
FIG. 12B is a perspective view of an airflow guide of FIG. 12A according to an exemplary embodiment.

FIGS. 12A and 12B illustrate an exemplary embodiment. In FIGS. 12A and 12B, the same members as in FIG. 2A to 2F will be denoted by the same reference numerals as in FIG. 2A to 2F.

FIG. 12A is a perspective view of a module system according to an exemplary embodiment.

Referring to FIG. 12A, a module system 149C according to an exemplary embodiment may include first to third semiconductor modules 33, 36 and 39. The first to third semiconductor modules 33, 36 and 39 may include first to third module substrates 3, 6 and 9, and first to third memory devices 13A, 13B, 16A, 16B, 19A and 19B disposed on front surfaces FS and back surfaces BS of the first to third module substrates 3, 6 and 9.

The first to third semiconductor modules 33, 36 and 39 may further include first to third registers 23A, 23B, 26A, 26B, 29A and 29B disposed on the front surfaces FS and the back surfaces BS of the first to third module substrates 3, 6 and 9, and airflow guides 118A, 118B and 118C disposed on the first to third registers 23A, 26A and 29A.

The airflow guides 118A, 118B and 118C may have the same shape as each other. In other exemplary embodiments, the airflow guides 118A, 118B and 118C may also be disposed on the top surfaces of the first to third registers 23B, 26B and 29B, which may be disposed on the back surfaces BS of the first to third module substrates 3, 6 and 9.

Here, each of the airflow guides 118A, 118B and 118C may not include the first and second pedestals 101 and 102 of FIG. 11B.

FIG. 12B is a perspective view of an airflow guide of FIG. 12A according to an exemplary embodiment.

Referring to FIG. 12B, the airflow guide 118A according to an exemplary embodiment may have rotation leading tubes 104 on the first register 23A. Each of the rotation leading tubes 104 may have rotation scales 105, respectively. The rotation leading tubes 104 may also be disposed on the second register 26A and the third register 29A.

The airflow guide 118A may have supporters 107 and a plate 109 of the airflow guide 114A of FIG. 11B. One end portion of the supporters 107 may be inserted into the rotation leading tubes 104, respectively. The supporters 107 may be rotated in a fourth direction R4. The supporters 107 may have rotation adjusters 108, respectively.

Figure 13A:
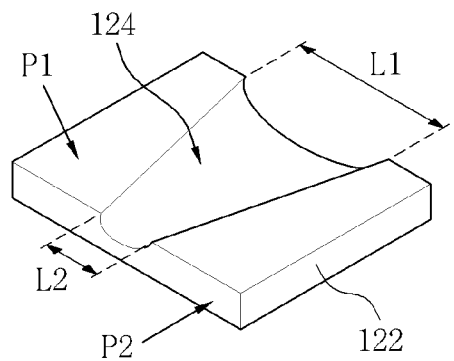
FIGS. 13A to 13C are perspective views of a plate according to an exemplary embodiment.

FIG. 13A is a perspective view of a plate according to an exemplary embodiment.

Referring to FIG. 13A, a plate 122 in an exemplary embodiment may have an air-flow guiding groove 124 in a guiding surface P1. In more detail, the air-flow guiding groove 124 may have a shape of a half-pipe.

The air-flow guiding groove 124 may be formed at least one in the guiding surface P1. The air-flow guiding groove 124 may traverse the guiding surface P1 and have openings in a leading surface P2 and an opposite surface to the leading surface P2. The openings may have different diameters.

The openings may have a first diameter L1 and a second diameter L2. The first diameter L1 may be larger than the second diameter L2. If the openings have different diameters, the plate 122 may effectively concentrate air passing through the openings of the leading surface P2 using the air-flow guiding groove 124.

The air-flow guiding groove 124 may also be formed in the guiding surface P1 of the plate 91 of FIGS. 8 and 9. The guiding surface P1 and the leading surface P2 of the plate 122 may correspond to the guiding surface P1 and the leading surface P2 of each of the plates 44A, 44B, 48A, 48B, 69, 89 and 109 of FIGS. 2 to 7, 10, 11 and 12.

Figure 13B:
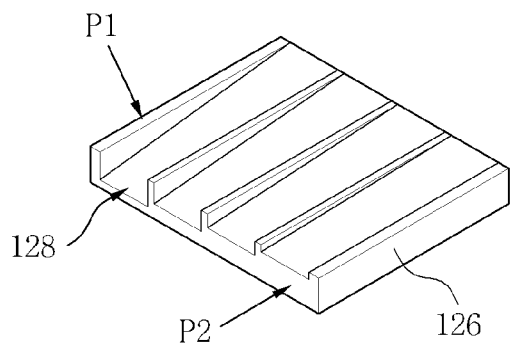

FIG. 13B is a perspective view of a plate according to an exemplary embodiment.

Referring to FIG. 13B, a plate 126 according to an exemplary embodiment may be substituted for plates 44A, 44B, 48A, 48B, 69, 89 and 109 of FIGS. 2 to 7, 10, 11 and 12. The plate 126 may have a plurality of air-flow guiding channels 128 in a guiding surface P1.

In addition, the air-flow guiding channels 128 may have the same inflection as the air-flow guiding groove 124 of FIG. 13A. The air-flow guiding channels 128 may also be formed at least one in the guiding surface P1. In more detail, each of the air-flow guiding channels 128 may be inclined between a leading surface P2, and an opposite surface to the leading surface P2.

Each of the air-flow guiding channels 128 may traverse the guiding surface P1 and have openings only in the leading surface P2. The plate 126 may enlarge an air injection area around the leading surface P2 using the air-flow guiding channels 128.

The air-flow guiding channels 128 may also be formed in the leading surface P2 of the plate 91 of FIGS. 8 and 9. The guiding surface P1 and the leading surface P2 of the plate 128 may correspond to the guiding surface P1 and the leading surface P2 of each of the plates 44A, 44B, 48A, 48B, 69, 89 and 109 of FIGS. 2 to 7, 10, 11 and 12.

Figure 13C:
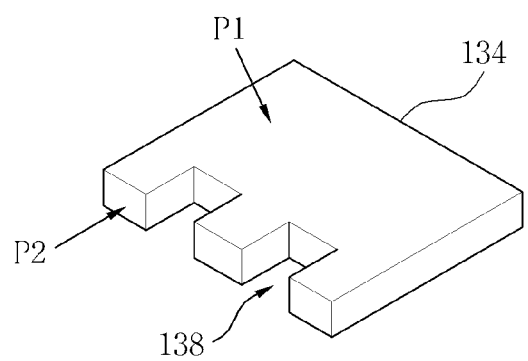

FIG. 13C is a perspective view of a plate according to an exemplary embodiment.

Referring to FIG. 13C, a plate 134 according to an exemplary embodiment may have a plurality of turbulent flow forming portions 138 around a leading surface P2. The turbulent flow forming portions 138 may extend from predetermined regions of the leading surface P2 toward an interior of the plate 134 and may penetrate the plate 134.

Only one of the turbulent flow forming portions 138 may also be formed in the plate 134. The turbulent flow forming portions 138 may vary a displacement of air passing through a guiding surface P1 and generate turbulent flow around the leading surface P2. The turbulent flow forming portions 138 may also be formed in the plate 91 of FIGS. 8 and 9.

The guiding surface P1 and the leading surface P2 of the plate 134 may be substituted for the guiding surface P1 and the leading surface P2 of the plates 44A, 44B, 48A, 48B, 69, 89 and 109 of FIGS. 2 to 7, 10, 11 and 12.

Figure 14:
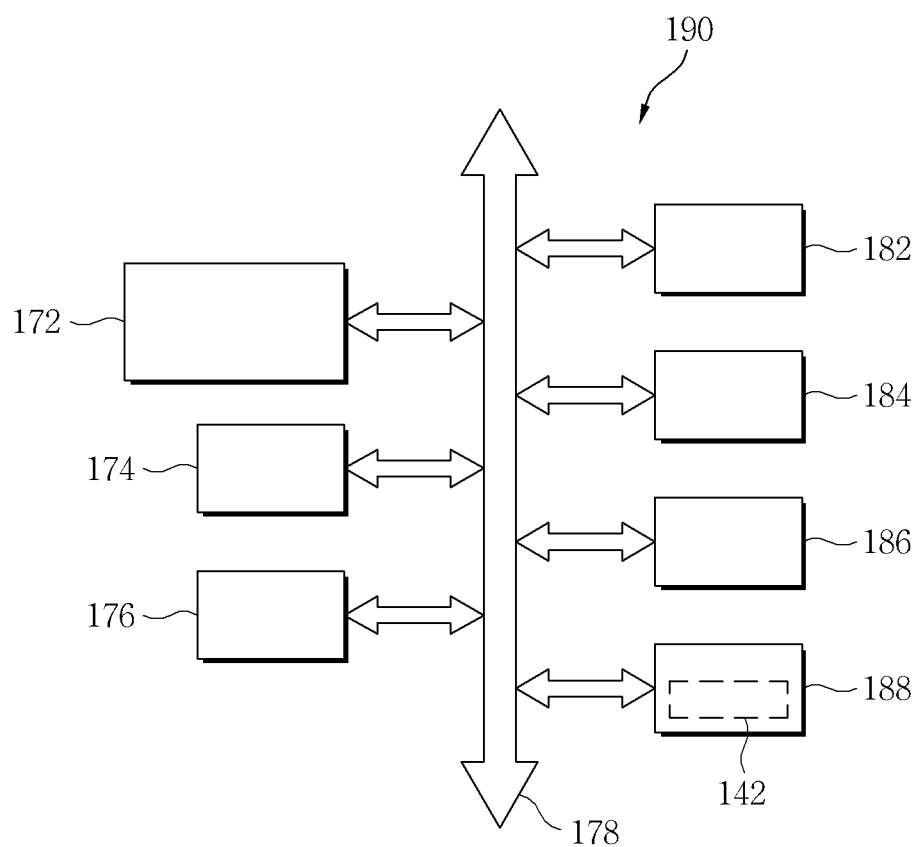
FIG. 14 is a plan view of an electronic system according to an exemplary embodiment.

FIG. 14 is a plan view of a process-based system according to an exemplary embodiment.

Referring to FIG. 14, a process-based system 190 according to an exemplary embodiment may include a central processing unit (CPU) 172, a floppy disk drive 174 and a compact disc ROM drive 176.

The central processing unit 172, the floppy disk drive 174 and the compact disc ROM drive 176 may be electronically connected to a bus line 178. Further, the process-based system 190 may further include an input device 182, an output device 184, a read-only memory (ROM) 186 and a random access memory (RAM) 188, which may be electronically connected to the bus line 178.

The RAM 188 may include the module system 142 of FIG. 2A. The RAM 188 may also include one of the module systems 143 to 147, 148A, 148B, 149A, 149B and 149C of FIGS. 3A, 4A, 5A, 6A, 7A, 8A, 9A, 10A, 11A, AND 12A. The processor-based system 190 may include a personal computer, a server, a process control system, or a different system from the foregoing.

As described above, according to one or more exemplary embodiments, a semiconductor module, a module system and an electronic system according to exemplary embodiments may include at least one airflow guide disposed on a module substrate and may concentrate air on predetermined regions of the module substrate and/or a neighboring module substrate during the electronic system is being driven.

A module system according to one or more exemplary embodiments may include an airflow guide and a register disposed between two module substrates and facing each other, and may easily lower a temperature of a register when the electronic system is being driven.

A module system according to one or more exemplary embodiments may include memory devices, airflow guides and registers disposed on a plurality of module substrates, and may easily lower a temperature of the memory devices and the registers during the electronic system is being driven.

An electronic system according to one or more exemplary embodiments may use at least one airflow guide in a module system, and may lower a temperature of the module system without having any heat sink in the electronic system.

An electronic system according to one or more exemplary embodiments may use at least one airflow guide in a module system, and may stabilize a driving environment of module substrates, memory devices and registers.

An electronic system according to exemplary embodiments may minimize a temperature of a module system during the electronic system is being driven, and may improve electrical characteristics thereof.

While exemplary embodiments have been particularly shown and described, it will be understood by those skilled in the art that various changes in form and details may be made therein without departing from the spirit and scope of the inventive concept as defined by the appended claims.

Accordingly, these and other changes and modifications are seen to be within the true spirit and scope of the invention as defined by the appended claims. It will be apparent to those skilled in the art that modifications and variations can be made in the inventive concepts without deviating from the spirit or scope of the invention. Thus, it is intended that the inventive concepts cover any such modifications and variations of this invention provided they come within the scope of the appended claims and their equivalents. Accordingly, these and other changes and modifications are seen to be within the true spirit and scope of the invention as defined by the appended claims.

What is claimed is:

1. A semiconductor module comprising:
   a substrate having a first surface and a second surface opposite to the first surface;
   a first semiconductor device disposed on the first surface of the substrate;
   an airflow guide disposed on the second surface of the substrate, wherein the airflow guide comprises a plate comprising a first end portion adjacent to the second surface of the substrate and a second end portion far from the second surface of the substrate; and
   a plurality of memory devices disposed on the first surface and the second surface of the substrate, wherein the first semiconductor device is disposed between a first pair of the memory devices on the first surface of the substrate, and the airflow guide is disposed between a second pair of the memory devices on the second surface of the substrate.

2. The semiconductor module of claim 1, wherein the airflow guide further comprises a pedestal disposed on the second surface of the substrate, wherein the first end portion fixed to the pedestal.

3. The semiconductor module of claim 2, wherein the airflow guide has a shape of a letter 'L'.

4. The semiconductor module of claim 3, wherein the plate forms an angle between about 45° and about 90° with respect to the substrate.

5. The semiconductor module of claim 2, further comprising a register, disposed on the first surface of the substrate, wherein, in a view perpendicular to the first surface of the substrate, the second end portion of the plate overlaps with the register.

6. The semiconductor module of claim 5, wherein the first end portion of the plate does not overlap with the register in the view perpendicular to the first surface of the substrate.

7. The semiconductor module of claim 1, wherein the plate comprises a groove formed therein.

8. The semiconductor module of claim 1, wherein the plate comprises a guiding surface comprising an inward guiding surface and an outward guiding surface extending from the inward guiding surface to the second end portion of the plate.

9. The semiconductor module of claim 8, wherein the inward guiding surface forms an angle between about 90° and about 180° with respect to the outward guiding surface.

10. The semiconductor module of claim 1, further comprising a second semiconductor device disposed between the second surface of the substrate and the airflow guide.

11. A module system comprising:
    a first module comprising a first substrate having a first surface and a second surface opposite to the first surface, and a first register disposed on the second surface of the first substrate; and
    a second module comprising a second substrate parallel to the first substrate and having a first surface and a second surface opposite to the first surface, and an airflow guide disposed on the first surface of the second substrate,
    wherein the airflow guide comprises a pedestal disposed on the first surface of the second substrate and a plate attached to the pedestal, wherein the plate extends from the pedestal toward the first register.

12. The module system of claim 11, wherein the second module further comprises a second register, disposed on the second surface of the second substrate, wherein the plate comprises an end portion disposed in a space between the first register and the second register.

13. The module system of claim 11, wherein: the first module further comprises a plurality of first memory devices disposed on the first surface and the second surface of the first substrate, and the second module further comprises a plurality of second memory devices disposed on the first surface and the second surface of the second substrate.

14. The module system of claim 11, wherein the plate is substantially planar, and an extension direction of the plate is perpendicular to the first surface of the second substrate.

15. A module system comprising:
- a first module comprising a first substrate having a first surface and a second surface opposite the first surface, a plurality of memory devices disposed on both surfaces of the first and second surfaces, and a first register disposed on the second surface of the first substrate; and
- a second module comprising a second substrate having a first surface and a second surface opposite the first surface, a plurality of memory devices disposed on both surfaces of the first and second surfaces, a first airflow guide disposed on the first surface of the second substrate, and a second register disposed on the second surface of the second substrate;
- wherein the airflow guide extends toward the first register.

16. The module system of claim 15, wherein the first airflow guide comprises a pedestal attached on the first surface of the second substrate and a plate having a first end portion fixed to the pedestal and a second end portion extending toward the first register.

17. The module system of claim 16, wherein the plate locates a virtually overlapping space between the first register and the second register.

18. The module system of claim 16, wherein the plate and the second register overlap across the second substrate.

19. The module system of claim 15, further comprising:
- a third module comprising a third substrate having a first surface and a second surface opposite the first surface, a plurality of memory devices disposed on the both surfaces of the first and second surfaces, a second airflow guide disposed on the first surface of the third substrate, and a third register disposed on the second surface of the third substrate,
- wherein the second airflow guide extends toward the second register,
- wherein the first and second airflow guide extend in parallel with each other.

* * * * *